US010477723B2

(12) United States Patent
Slessman et al.

(10) Patent No.: US 10,477,723 B2
(45) Date of Patent: **\*Nov. 12, 2019**

(54) SIDE-COOLED MODULAR DATA CENTER

(71) Applicant: Baselayer Technology, LLC, Chandler, AZ (US)

(72) Inventors: William Slessman, Chandler, AZ (US); Andreas Zoll, Chandler, AZ (US)

(73) Assignee: BASELAYER TECHNOLOGY, LLC, Mesa, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/711,533

(22) Filed: Sep. 21, 2017

(65) Prior Publication Data

US 2018/0014428 A1 Jan. 11, 2018

Related U.S. Application Data

(63) Continuation of application No. 15/139,590, filed on Apr. 27, 2016, now Pat. No. 9,814,160.

(Continued)

(51) Int. Cl.
*H05K 7/20* (2006.01)
*H05K 7/14* (2006.01)

(52) U.S. Cl.
CPC ....... *H05K 7/20145* (2013.01); *H05K 7/1497* (2013.01); *H05K 7/202* (2013.01); *H05K 7/2059* (2013.01); *H05K 7/2079* (2013.01); *H05K 7/20609* (2013.01); *H05K 7/20745* (2013.01); *H05K 7/20836* (2013.01)

(58) Field of Classification Search
CPC ............... H05K 7/1497; H05K 7/2059; H05K 7/20745; H05K 7/2079; H05K 7/20827
See application file for complete search history.

(56) References Cited

U.S. PATENT DOCUMENTS 6,459,574 B1 * 10/2002 Ghosh ................... G06F 1/1632
165/80.4
6,691,197 B2 * 2/2004 Olson ................... G06F 1/1632
361/679.41

(Continued)

FOREIGN PATENT DOCUMENTS

EP 2900045 A1 7/2015

OTHER PUBLICATIONS

International Bureau of WIPO, International Search Report in Application No. PCT/US2016/029455 dated Jul. 27, 2016.

*Primary Examiner* — Robert J Hoffberg
(74) *Attorney, Agent, or Firm* — Bycer Law, PLC; Matthew L. Bycer

(57) ABSTRACT

A modular data center includes a cooling module with a cooling module enclosure and a first cooling unit housed within the cooling module enclosure. The cooling module enclosure includes a first interface side wall with a first cooling module supply opening that receives a first portion of cooling air from the first cooling unit. The center further includes a data module with a data module enclosure for housing data equipment. The data module enclosure includes a second interface side wall with a first data module supply opening that receives the first portion of cooling air from the first cooling module supply opening such that the first portion of cooling air flows into the data module enclosure and removes heat from the data equipment.

19 Claims, 25 Drawing Sheets

Related U.S. Application Data

(60) Provisional application No. 62/155,901, filed on May 1, 2015.

(56) References Cited

U.S. PATENT DOCUMENTS

| | | | |
|---|---|---|---|
| 6,845,008 B2 * | 1/2005 | Pokharna | G06F 1/203 |
| | | | 165/104.33 |
| 7,278,273 B1 | 10/2007 | Whitted et al. | |
| 7,511,960 B2 | 3/2009 | Hillis et al. | |
| 7,551,971 B2 | 6/2009 | Hillis | |
| 7,852,627 B2 | 12/2010 | Schmitt et al. | |
| 7,854,652 B2 | 12/2010 | Yates et al. | |
| 7,894,945 B2 | 2/2011 | Hillis | |
| 8,000,099 B2 * | 8/2011 | Parker | G06F 1/1632 |
| | | | 174/16.1 |
| 8,046,896 B2 | 11/2011 | Schmitt et al. | |
| 8,047,904 B2 | 11/2011 | Yates et al. | |
| 8,251,785 B2 | 8/2012 | Schmitt et al. | |
| 8,270,154 B2 | 9/2012 | Anderson et al. | |
| 8,462,496 B2 | 6/2013 | Schmitt et al. | |
| 8,488,311 B2 | 7/2013 | Tsai | |
| 8,549,869 B1 | 10/2013 | Whitted et al. | |
| 8,734,212 B2 | 5/2014 | Peng et al. | |
| 8,755,184 B2 | 6/2014 | Peng et al. | |
| 8,798,797 B2 | 8/2014 | Bauchot et al. | |
| 9,101,080 B2 | 8/2015 | Czamara et al. | |
| 9,155,229 B2 | 10/2015 | Schmitt et al. | |
| 9,237,681 B2 * | 1/2016 | Slessman | H05K 7/20745 |
| 9,345,173 B2 | 5/2016 | Czamara et al. | |
| 9,363,925 B2 | 6/2016 | Czamara et al. | |
| 9,380,731 B2 | 6/2016 | Faig Palomer | |
| 9,565,783 B1 | 2/2017 | Whitted et al. | |
| 9,661,788 B2 * | 5/2017 | Slessman | H05K 7/20836 |
| 9,670,689 B2 * | 6/2017 | Dechene | E04H 5/02 |
| 9,671,689 B2 | 6/2017 | Dechene et al. | |
| 9,790,701 B2 * | 10/2017 | Ziegler | E04H 5/02 |
| 9,814,160 B2 * | 11/2017 | Slessman | H05K 7/2079 |
| 9,857,089 B2 * | 1/2018 | Slessman | H05K 7/20745 |
| 10,039,207 B2 * | 7/2018 | Schmitt | H05K 7/1497 |
| 2008/0060372 A1 | 3/2008 | Hillis et al. | |
| 2008/0060790 A1 | 3/2008 | Yates et al. | |
| 2008/0064317 A1 | 3/2008 | Yates et al. | |
| 2009/0198388 A1 | 8/2009 | Hillis | |
| 2011/0239679 A1 * | 10/2011 | Dechene | E04H 5/02 |
| | | | 62/259.2 |
| 2011/0239680 A1 * | 10/2011 | Dechene | E04H 5/02 |
| | | | 62/259.2 |
| 2011/0240497 A1 * | 10/2011 | Dechene | E04H 5/02 |
| | | | 206/320 |
| 2012/0258654 A1 | 10/2012 | Peng et al. | |
| 2012/0302150 A1 | 11/2012 | Schmitt et al. | |
| 2013/0148291 A1 * | 6/2013 | Slessman | G06F 1/20 |
| | | | 361/679.46 |
| 2014/0150999 A1 | 6/2014 | Wei | |
| 2014/0190191 A1 * | 7/2014 | Slessman | H05K 7/20836 |
| | | | 62/91 |
| 2014/0254085 A1 | 9/2014 | Slessman | |
| 2016/0037685 A1 | 2/2016 | Ross | |
| 2017/0105310 A1 | 4/2017 | Chen | |
| 2017/0238444 A1 * | 8/2017 | Slessman | H05K 7/20836 |
| | | | 361/679.47 |
| 2017/0254085 A1 | 9/2017 | Larkin | |
| 2017/0367223 A1 * | 12/2017 | Bailey | H05K 7/20836 |
| 2018/0119971 A1 * | 5/2018 | Slessman | H05K 7/20745 |

* cited by examiner

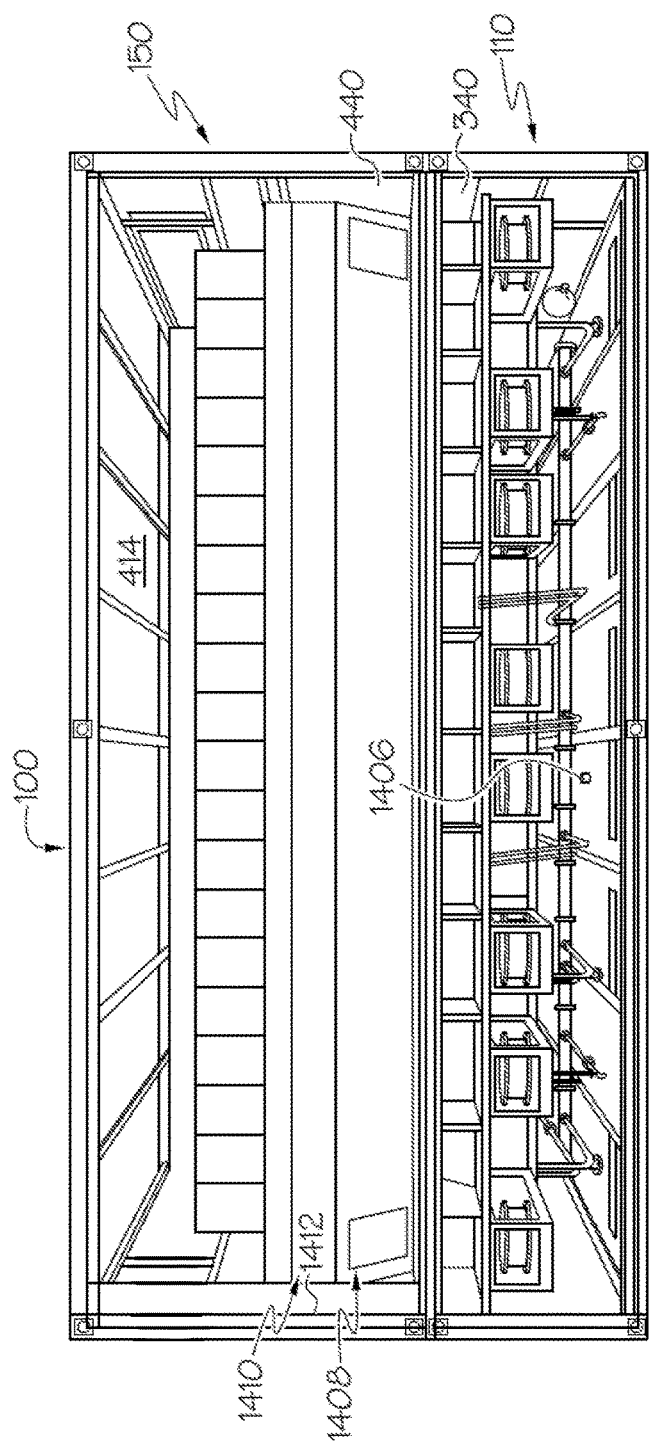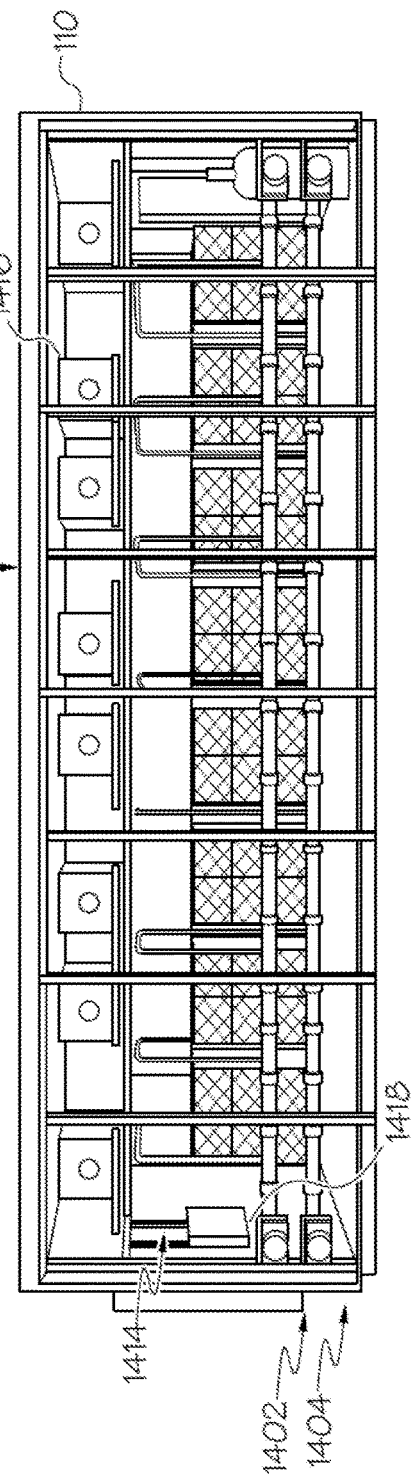

System Startup

| Item | | Description | Range if Adjustable |
|---|---|---|---|
| 1. | | Hardware Pre-Startup Settings | |
| | a. | Fan Bank Switch is set to Auto | Auto or Manual |
| | b. | CBMA Breaker is closed | |
| | c. | Control Panel Source A is Available | |
| | d. | CBMB Breaker is closed | |
| | e. | Control Panel Source B is Avaialbe | |
| | f. | CB1-CB22 are closed | |
| | g. | Telemetry Power A is Available | |
| | h. | Telemetry Power B is Available | |
| | i. | CBA Breaker is closed | |
| | j. | CBB Breaker is closed | |
| 2. | | OS Pre-Startup Settings | |
| | a. | Coil Sensible Temperature Setpoint is set for Cold Aisle (Default 75F) | 64-81 |
| | b. | HA Temperature Setpoint is set for Hot Aisle (Default 102F) | 80-104 |
| | c. | Humidifier OFF Dew point Setpoint is set (Default 49F) | 0-100 |
| | d. | Humidifier ON Dew point Setpoint is set (Default 59F) | 0-100 |
| | e. | Cooling Fan Mode Auto is set to Auto | Auto or Override |
| | f. | If Cooling Fan Mode is in Auto, then, FAN CFM Demand is from the PLC | |
| | g. | Makeup Air Damper Status is set to Open | Open or Closeed |
| | h. | Chilled Water Valves All Auto is set to Open | Auto or Manual |
| | i. | Fan CFM Low Limit is set (Default 2000 CFM) | 0 - 12500 |
| | j. | Fan CFM Manual Mode Setpoint (Default 2000 CFM) | 0 - 12500 |
| | k. | Makeup Air Damper Deviation Timer | 0 - 100 |
| | l. | Air Density is set (Default 0.07) | 0.00 - 0.10 |
| | m. | Zone 1 Cooling is set to Enabled | Enabled or Disabled |
| | n. | Zone 2 Cooling is set to Enabled | Enabled or Disabled |
| | o. | Zone 3 Cooling is set to Enabled | Enabled or Disabled |
| | p. | Zone 4 Cooling is set to Enabled | Enabled or Disabled |
| 3. | | Startup | |
| | a. | In OS, set Module Start/Stop to "Start" | Start or Stop |
| | b. | All 8 fans ramp up to "Fan CFM Low Limit" | |
| | c. | Make-Up Air Damper IT Block Opens | |
| | d. | Make-Up Air Damper CB Opens | |
| | e. | All 8 CCVs open up to maintain "Coil Sensible Temperature Setpoint" | |
| | f. | Humidifed turns ON based on "Humidifier ON Dew Point Setpoint | |

FIG. 25A

Normal Operating Conditions (Auto)

| Item | | Description | Setting |
|---|---|---|---|
| 1. | | Fan Operation | |
| | a. | Fan Status 1 shows OK if Fan 1 is energized | |
| | b. | Fan Status 3 shows OK if Fan 3 is energized | |
| | c. | Fan Status 4 shows OK if Fan 4 is energized | |
| | d. | Fan Status 6 shows OK if Fan 6 is energized | |
| | e. | Fan Status 7 shows OK if Fan 7 is energized | |
| | f. | Fan Status 9 shows OK if Fan 9 is energized | |
| | g. | Fan Status 10 shows OK if Fan 10 is energized | |
| | h. | Fan Status 12 shows OK if Fan 12 is energized | |
| | i. | All (8) fans caclute Air Flow (ACFM) utilizing the DP sensors $ACFM = 1114.064 \times (\Delta P/\rho_{Air})^{1/2}$ | $\rho_{Air}$ = altitude of location in lb./cu. Ft. $\Delta P$ = IWG |
| | j. | All (8) fans caclute Air Flow (SCFM) utilizing the DP sensors $SCFM = 4067.986 \times (\Delta P)^{1/2}$ | $\Delta P$ = IWG |
| | k. | All (8) fans ramp up to "Fan CFM Low Limit" as the minimum speed | 2000 |
| | l. | HA Temperature Setpoint is set controlling all (4) HA Temperature Sensors | 102 |
| | m. | If ANY of the (4) HA Zone temperatures exceed "HA Temperature Setpoint", all (8) fans modulate to decrease the temperature of all (4) HA Temperature Sensors to "HA Temperature Setpoint" | |
| | n. | All (8) Fans always display "Fan CFM Feedback" | |
| | o. | All (8) Fans always display "Fan CFM Demand" | |
| | p. | All (8) Fans always display "Fan Runtime" | |
| | q. | All (8) Fans have "Fan Runtime" that is resettable from the OS | Yes or No |
| | r. | All (8) Fans always display "Fan Mode" | Auto or Override |
| 2. | | Coil Operation | |
| | a. | All (8) CCVs modulate to Master "Coil Sensible Temperature Setpoint" | 75°F |
| | b. | CCV1 modules to maintain Coil 1 Sensible Temperature | |
| | c. | CCV2 modules to maintain Coil 2 Sensible Temperature | |
| | d. | CCV3 modules to maintain Coil 3 Sensible Temperature | |
| | e. | CCV4 modules to maintain Coil 4 Sensible Temperature | |
| | f. | CCV5 modules to maintain Coil 5 Sensible Temperature | |
| | g. | CCV6 modules to maintain Coil 6 Sensible Temperature | |
| | h. | CCV7 modules to maintain Coil 7 Sensible Temperature | |
| | i. | CCV8 modules to maintain Coil 8 Sensible Temperature | |
| | j. | Failure of a CCV, CCV stays at last known state | |

FIG. 25B

| | | |
|---|---|---|
| k. | CCV Feedback reports an alarm to the OS if it does NOT match within 5% of CCV Demand signal for a period of 150 seconds. | |
| l. | Failure of CCV Coil Sensible Temperature Sensor, CCV for the designated coil stays at last known state | |
| m. | Water Flow DP Sensor is used to calculate CCV Coil Flow (in GPM) for the designated coil. 2" Circuit Setter (CS) is set to orifice for the calculation $GMP = 28.0365 \times (\Delta P_{CS}(\text{in psid}))^{1/2}$ | |

Zone Control

| Item | Description | Setting |
|---|---|---|
| 1. | Zone 1 Control | |
| a. | Fan Mode is in AUTO | |
| b. | Zone 1 is Enabled | |
| c. | Zone 2 is Disabled | |
| d. | Zone 3 is Disabled | |
| e. | Zone 4 is Disabled | |
| f. | Fan 1 Demand is set based off of "Fan CFM Demand" from PLC | |
| g. | Fan 3 Demand is set based off of "Fan CFM Demand" from PLC | |
| h. | Fan 4 Demand is set to 0 from the PLC | |
| i. | Fan 6 Demand is set to 0 from the PLC | |
| j. | Fan 7 Demand is set to 0 from the PLC | |
| k. | Fan 9 Demand is set to 0 from the PLC | |
| l. | Fan 10 Demand is set to 0 from the PLC | |
| m. | Fan 12 Demand is set to 0 from the PLC | |
| n. | Fan 1 Feedback reports CFM based off of PLC calcuation | |
| o. | Fan 3 Feedback reports CFM based off of PLC calcuation | |
| p. | Fan 4 Feedback reports CFM based off of PLC calcuation | |
| q. | Fan 6 Feedback reports CFM based off of PLC calcuation | |
| r. | Fan 7 Feedback reports CFM based off of PLC calcuation | |
| s. | Fan 9 Feedback reports CFM based off of PLC calcuation | |
| t. | Fan 10 Feedback reports CFM based off of PLC calcuation | |
| u. | Fan 12 Feedback reports CFM based off of PLC calcuation | |
| v. | If ANY of the (4) HA Zone temperature exceed "HA Temperature Setpoint", Fan 1 and Fan 3 modulate to decrease the temperature of all (4) HA Temperature Sensors to AT or BELOW "HA Temperature Setpoint" | |

FIG. 25C

| | | |
|---|---|---|
| 2. | Zone 2 Control | |
| a. | Fan Mode is in AUTO | |
| b. | Zone 1 is Disabled | |
| c. | Zone 2 is Enabled | |
| d. | Zone 3 is Disabled | |
| e. | Zone 4 is Disabled | |
| f. | Fan 1 Demand is set to 0 from the PLC | |
| g. | Fan 3 Demand is set to 0 from the PLC | |
| h. | Fan 4 Demand is set based off of "Fan CFM Demand" from the PLC | |
| i. | Fan 6 Demand is set based off of "Fan CFM Demand" from the PLC | |
| j. | Fan 7 Demand is set to 0 from the PLC | |
| k. | Fan 9 Demand is set to 0 from the PLC | |
| l. | Fan 10 Demand is set to 0 from the PLC | |
| m. | Fan 12 Demand is set to 0 from the PLC | |
| n. | Fan 1 Feedback reports CFM based off of PLC calcuation | |
| o. | Fan 3 Feedback reports CFM based off of PLC calcuation | |
| p. | Fan 4 Feedback reports CFM based off of PLC calcuation | |
| q. | Fan 6 Feedback reports CFM based off of PLC calcuation | |
| r. | Fan 7 Feedback reports CFM based off of PLC calcuation | |
| s. | Fan 9 Feedback reports CFM based off of PLC calcuation | |
| t. | Fan 10 Feedback reports CFM based off of PLC calcuation | |
| u. | Fan 12 Feedback reports CFM based off of PLC calcuation | |
| v. | If ANY of the (4) HA Zone temperature exceed "HA Temperature Setpoint", Fan 4 and Fan 8 modulate to decrease the temperature of all (4) HA Temperature Sensors to AT or BELOW "HA Temperature Setpoint" | |
| 3. | Zone 3 Control | |
| a. | Fan Mode is in AUTO | |
| b. | Zone 1 is Disabled | |
| c. | Zone 2 is Disabled | |
| d. | Zone 3 is Enabled | |
| e. | Zone 4 is Disabled | |
| f. | Fan 1 Demand is set to 0 from the PLC | |
| g. | Fan 3 Demand is set to 0 from the PLC | |
| h. | Fan 4 Demand is set to 0 from the PLC | |
| i. | Fan 6 Demand is set to 0 from the PLC | |

FIG. 25D

| | | |
|---|---|---|
| j. | Fan 7 Demand is set based off of "Fan CFM Demand" from the PLC | |
| k. | Fan 9 Demand is set based off of "Fan CFM Demand" from the PLC | |
| l. | Fan 10 Demand is set to 0 from the PLC | |
| m. | Fan 12 Demand is set to 0 from the PLC | |
| n. | Fan 1 Feedback reports CFM based off of PLC calcuation | |
| o. | Fan 3 Feedback reports CFM based off of PLC calcuation | |
| p. | Fan 4 Feedback reports CFM based off of PLC calcuation | |
| q. | Fan 6 Feedback reports CFM based off of PLC calcuation | |
| r. | Fan 7 Feedback reports CFM based off of PLC calcuation | |
| s. | Fan 9 Feedback reports CFM based off of PLC calcuation | |
| t. | Fan 10 Feedback reports CFM based off of PLC calcuation | |
| u. | Fan 12 Feedback reports CFM based off of PLC calcuation | |
| v. | If ANY of the (4) HA Zone temperature exceed "HA Temperature Setpoint", Fan 7 and Fan 9 modulate to decrease the temperature of all (4) HA Temperature Sensors to AT or BELOW "HA Temperature Setpoint" | |
| 4. | Zone 4 Control | |
| a. | Fan Mode is in AUTO | |
| b. | Zone 1 is Disabled | |
| c. | Zone 2 is Disabled | |
| d. | Zone 3 is Disabled | |
| e. | Zone 4 is Enabled | |
| f. | Fan 1 Demand is set to 0 from the PLC | |
| g. | Fan 3 Demand is set to 0 from the PLC | |
| h. | Fan 4 Demand is set to 0 from the PLC | |
| i. | Fan 6 Demand is set to 0 from the PLC | |
| j. | Fan 7 Demand is set to 0 from the PLC | |
| k. | Fan 9 Demand is set to 0 from the PLC | |
| l. | Fan 10 Demand is set based off of "Fan CFM Demand" from the PLC | |
| m. | Fan 12 Demand is set based off of "Fan CFM Demand" from the PLC | |
| n. | Fan 1 Feedback reports CFM based off of PLC calcuation | |
| o. | Fan 3 Feedback reports CFM based off of PLC calcuation | |
| p. | Fan 4 Feedback reports CFM based off of PLC calcuation | |
| q. | Fan 6 Feedback reports CFM based off of PLC calcuation | |
| r. | Fan 7 Feedback reports CFM based off of PLC calcuation | |
| s. | Fan 9 Feedback reports CFM based off of PLC calcuation | |

FIG. 25E

| | | |
|---|---|---|
| t. | Fan 10 Feedback reports CFM based off of PLC calcuation | |
| u. | Fan 12 Feedback reports CFM based off of PLC calcuation | |
| v. | If ANY of the (4) HA Zone temperature exceed "HA Temperature Setpoint", Fan 10 and Fan 12 modulate to decrease the temperature of all (4) HA Temperature Sensors to AT or BELOW "HA Temperature Setpoint" | |

Failure Scenarios

| Item | Description | Point in Alarm |
|---|---|---|
| 1. | Loss of Power to a Fan | |
| a. | Fan Status for the specific fan goes into ALARM | Fan Status |
| b. | Remaining fans conotinue to modulate to maintain "HA Temperature Setpoint" from any HA Temperature Sensor that goes above the Setpoint | |
| c. | "Fan CFM Feedback" continues to be calculated and displayed in OS | |
| d. | "Fan CFM Demand" continues to display last value received/sent to the PLC | |
| 2. | Return of Power to a Fan | |
| a. | Fan Status for the specific fan when energized goes back to OK | Fan Status |
| b. | Failed fan reamps up to "Fan CFM Demand" sent to the rest of fans (all fans have same Fan CFM Demand given" | |
| c. | Fans reamin at "Fan CFM Demand" until HA Temperaure Setpoint is reached | |
| 3. | Loss of Communication to a Fan | |
| a. | Fan continues to run at last known state | Fan CFM Demand |
| 4. | Return of Communication to a Fan | |
| a. | Fan continues to run at least known state | Fan Mode |
| b. | Once Fan can read Fan CFM Demand, fan uses Demand signal rather than last known state | |
| 5. | Loss of Power or Communication to a CCV | |
| a. | CCV for the designated coil stays at the position last known | Chilled Water Valve Mode |
| 6. | Return of Power or Communication to a CCV | |
| a. | CCV for the designated coil stays at the position last known | |
| b. | Once Fan can read Chilled Water Valve Demand, CCV uses Demand signal rather than last known state | |
| 7. | Failure of a CCV not caused by Power/Comms | |
| a. | CCV is unable to meet "Coil Sensible Temperature Setpoint" | |
| b. | CCV begins to open up until it meets "Coil Sensible Temperature Setpoint" | |

FIG. 25F

| | | |
|---|---|---|
| c. | CCV opens up to 100% and is still unable to meet "Coil Sensible Temperature Setpoint" | |
| d. | CCV remains at 100% open | |
| 8. | Return of a Failed CCV not caused by Power/Comms | |
| a. | CCV is 100% open | |
| b. | CCV begins to modulate until it meets "Coil Sensible Temperature Setpoint" for the designated coil | |
| 9. | Failure of a HA Temperature Sensor | |
| a. | Remaining HA Temperature Sensors continue to control fans via the "HA Temperature Setpoint" | |
| 10. | Return of a Failed HA Temperature Sensor | |
| a. | HA Temperature Sensor returns, and all HA Temperature Sensors continue to display readings | |
| 11. | Failure of ALL (4) HA Temperature Sensor | |
| a. | All (8) Fans remain at last known state given from "Fan CFM Demand" | |
| 12. | Return of any HA Temperature Sensor after ALL (4) Failure | |
| a. | All (8) Fans modulate to maintain "HA Temperature Setpoint" from working HA Temperature Sensor(s) | |
| 13. | Failure of a CWS Temperature Sensor | |
| a. | Remaining CWS Temperature Sensor continues to monitor Supply Water temperature | |
| 14. | Return of a CWS Temperature Sensor | |
| a. | CWS Temperature Sensor returns, and continues to display readings | |

FIG. 25G

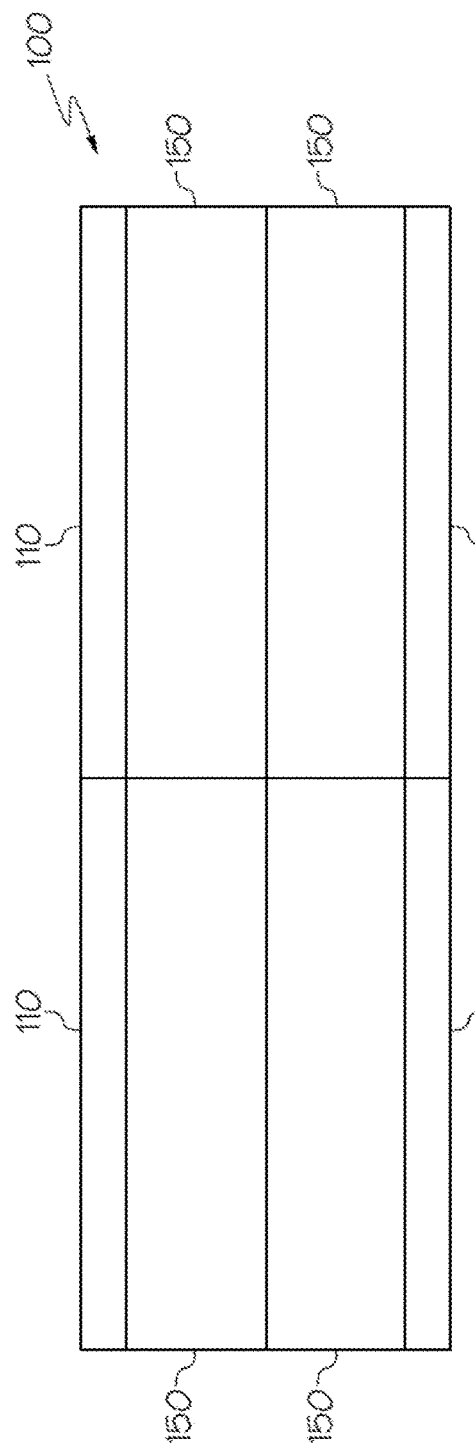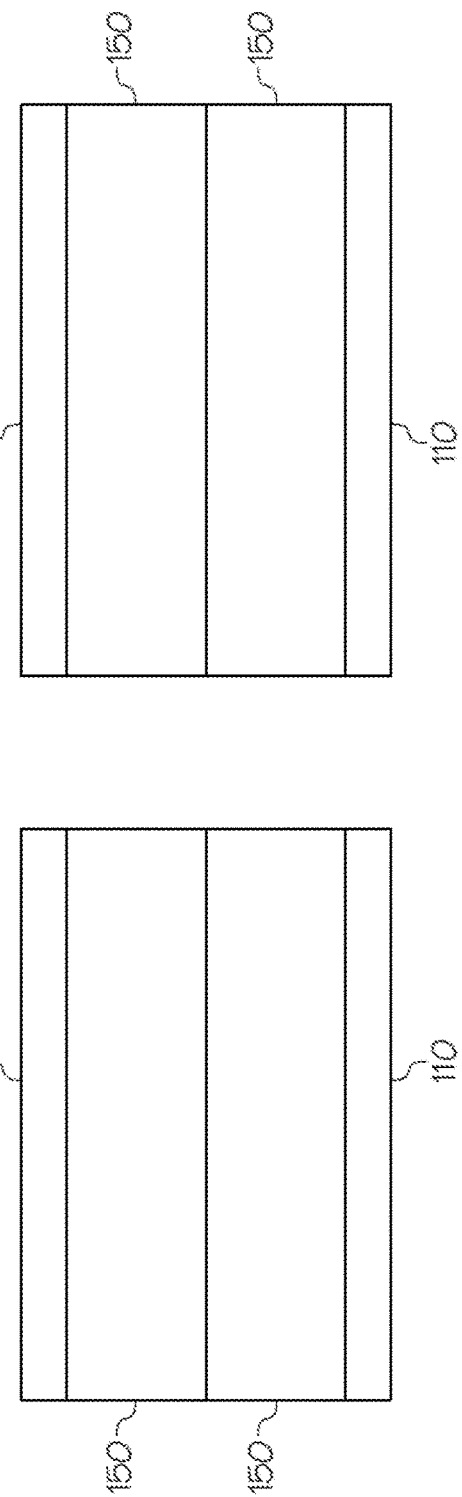

SIDE-COOLED MODULAR DATA CENTER

CROSS-REFERENCES TO RELATED APPLICATIONS

This application is a continuation of and claims priority to U.S. patent application Ser. No. 15/139,590 filed Apr. 27, 2016 and incorporated herein by reference. U.S. patent application Ser. No. 15/139,590 claims priority to U.S. Provisional Patent Application No. 62/155,901 filed May 1, 2015 and incorporated herein by reference.

The following publications are incorporated herein by reference: 2015/0028617; 2014/0287671; 2014/0343745; 2014/0254085; 2014/0031956; 2014/0190191; 2014/0103678; 2014/0190198; 2013/0211556; 2013/0190899; 2013/0148291; 2012/0014061; 2012/0014060; 2010/0151781; 2010/0139908; 2010/0139887; 2010/0141105; and 2010/0019419.

TECHNOLOGICAL FIELD

The present technology relates generally to data centers and, more specifically, to modular data centers.

BACKGROUND

Generally, data centers are facilities that support the operation of IT equipment. In one aspect, a data center can involve managing the environment of the IT equipment (e.g., managing the temperature of the environment surrounding the IT equipment) to provide cooling for the IT equipment. Typical approaches to managing the environment of the IT equipment can lead to excessive power usage and inefficiency and/or insufficient temperature management.

SUMMARY

Accordingly, there is a need for methods and systems for efficiently managing the data center environment. In one aspect, a cooling module may provide cooling air to a data module in a side-by-side configuration such that the cooling air enters the data module from the side, i.e., horizontally. This eliminates the need for sub-floor space to provide cooling air.

In one exemplary embodiment, a modular data center may include a cooling module and a data module. The cooling module includes a first enclosure and a cooling unit housed within the first enclosure, and the first enclosure defines a first supply channel in a first side wall. The cooling module is configured to cool a flow of air and direct the cooled air through the supply channel. The data module includes a second enclosure for housing data equipment, and the second enclosure defines a supply opening in a second side wall. The data module is coupled to the cooling module such that the first supply channel is fluidly coupled to the supply opening to receive the flow of air from the cooling module.

BRIEF DESCRIPTION OF THE DRAWINGS

FIG. 14 is top view of the data center of FIG. 1 in accordance with an exemplary embodiment;

FIG. 15 is side view of the data center of FIG. 1 in accordance with an exemplary embodiment;

FIGS. 25A-G are a chart that lists exemplary sequences of operation of the data center of FIG. 1 in accordance with an exemplary embodiment;

FIGS. 26 and 27 are module configurations for combination of cooling modules and data modules of the data center in accordance with an exemplary embodiment.

DETAILED DESCRIPTION

Described herein are modular data centers and methods of controlling the same. In some embodiments, a data center can provide an operating environment for IT equipment, such as servers, storage devices, networking devices, power distribution equipment, uninterruptible power supplies, etc. For example, a data center can facilitate cooling IT equipment, which can generate heat when operating. In some embodiments, a data center can include an air module and one or more data center modules (e.g., data modules or other data center modules) housed in a building. Air modules can intake air from the surrounding environment ("return air") (e.g., air from within the building housing the data center). Air modules can intake air from the outdoors ("outside air") (e.g., via a duct connected to the exterior of the data center). Cooling (or air) modules can condition return air, outside air, and/or a mixture thereof to provide to the data modules. Cooling modules can be connected to data modules via ducts, pipes, or other conduits to provide conditioned air ("supply air") to the data modules. Within the data modules, heat energy can be transferred from IT equipment to air. Air within the data modules can be exhausted from the data modules via vents, ducts, pipes, or other conduits connected to one or more cooling modules or into the surrounding environment (e.g., into the building housing the data center). The supply air from the cooling modules can be at a lower temperature than the air within the data modules. When the supply air enters the data module, it can be used to cool IT equipment. As a result of cooling IT equipment within the data module, air can be at an elevated temperature, and upon return to the cooling module, may be cooled again prior to providing it to the data modules as supply air.

As will be described in greater detail below, the cooling module can use different techniques to provide supply air at a desired temperature and/or humidity, including selectively mixing of return air with outside air, evaporative cooling (e.g., direct or indirect evaporative cooling), a fluid-based heat exchanger (e.g., mechanical cooling or a cooling coil), and/or a dehumidifier. In some embodiments, the manner in which the cooling module provides the air may increase overall efficiency, e.g., by using less power to provide supply air to the data modules at a desired temperature and/or humidity.

Figure 1:
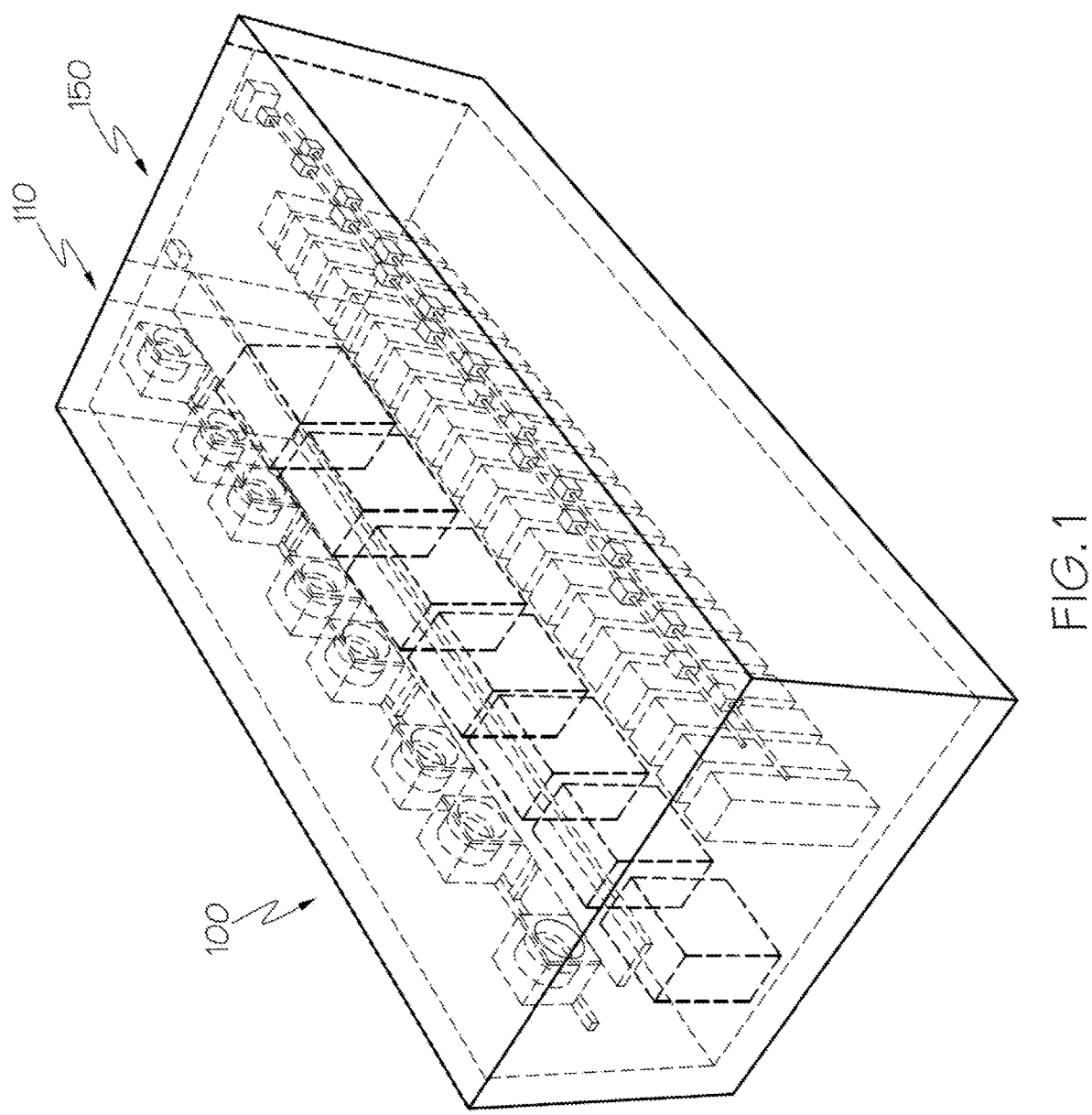
FIG. 1 is a isometric view of a modular data center with the outer walls removed in accordance with an exemplary embodiment.

FIG. 1 depicts a partially transparent, isometric view of a data center 100. The data center 100 may include one or more modules 110, 150. In one exemplary embodiment, the data center 100 includes a cooling module 110 and a data module 150. As described below, the cooling module 110 functions to circulate cooling air through the center 100, particularly the data module 150.

Figure 2:
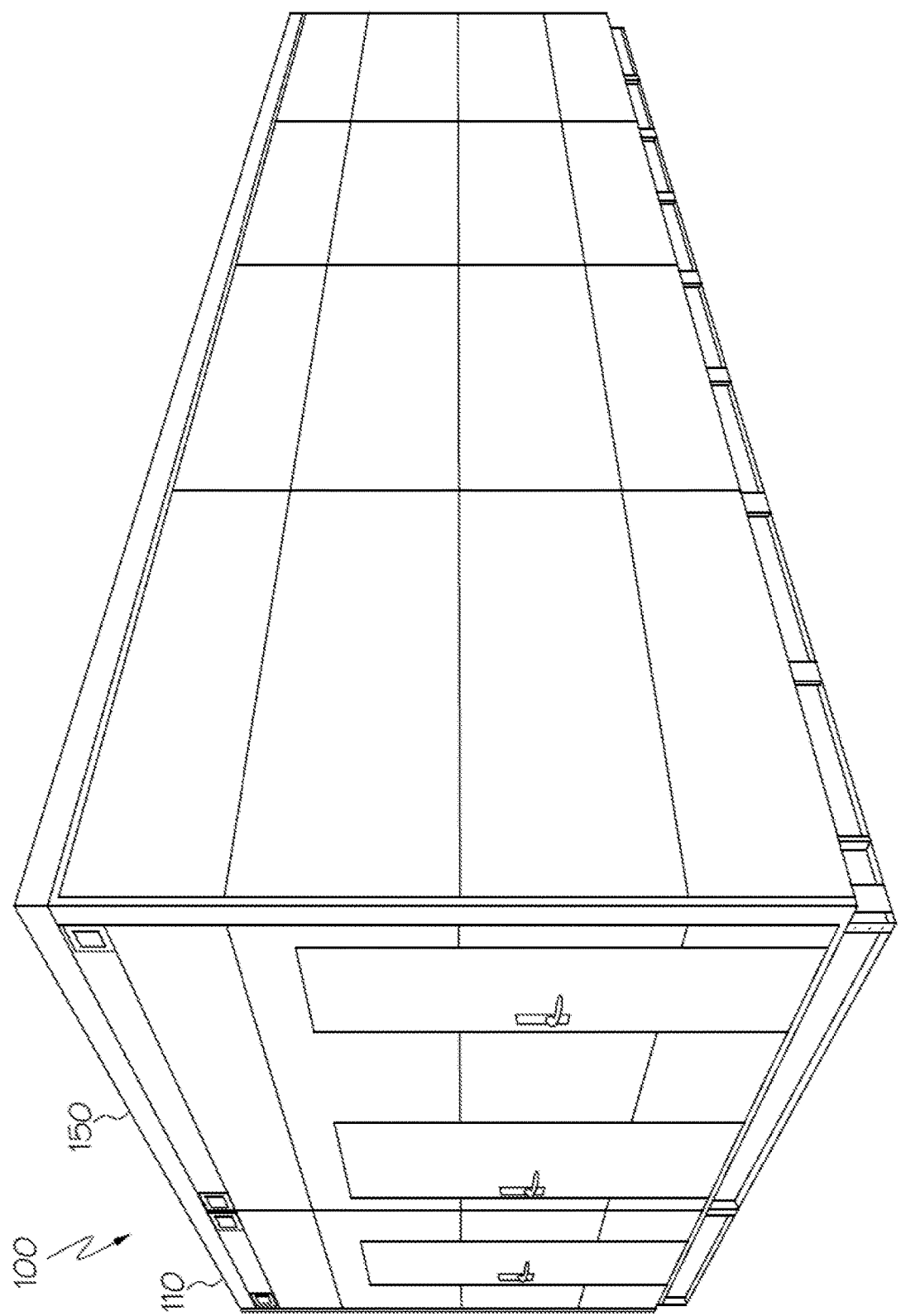
FIG. 2 is an outer isometric view of the modular data center of FIG. 1 in accordance with an exemplary embodiment.

Reference is briefly made to FIG. 2, which is an exterior view of the data center 100. In one exemplary embodiment, the data center 100 is an outdoor deployable module-based center with exemplary dimensions of 512" L×246" W×159" H, with an operating temperature range of −30 F to 140 F, as examples.

Figure 3:
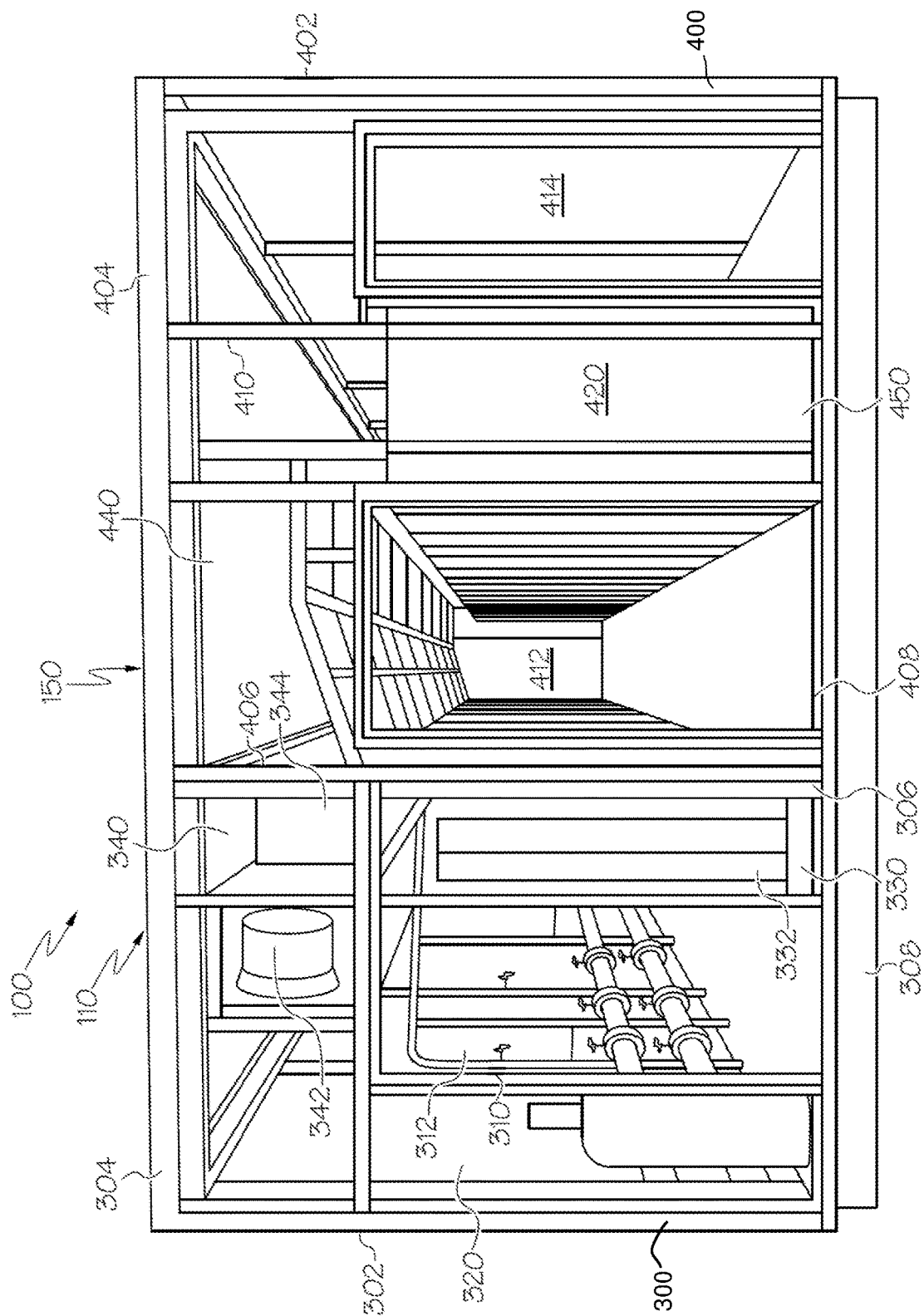
FIG. 3 is an end view of the modular data center of FIG. 1 in accordance with an exemplary embodiment.
Figure 4:
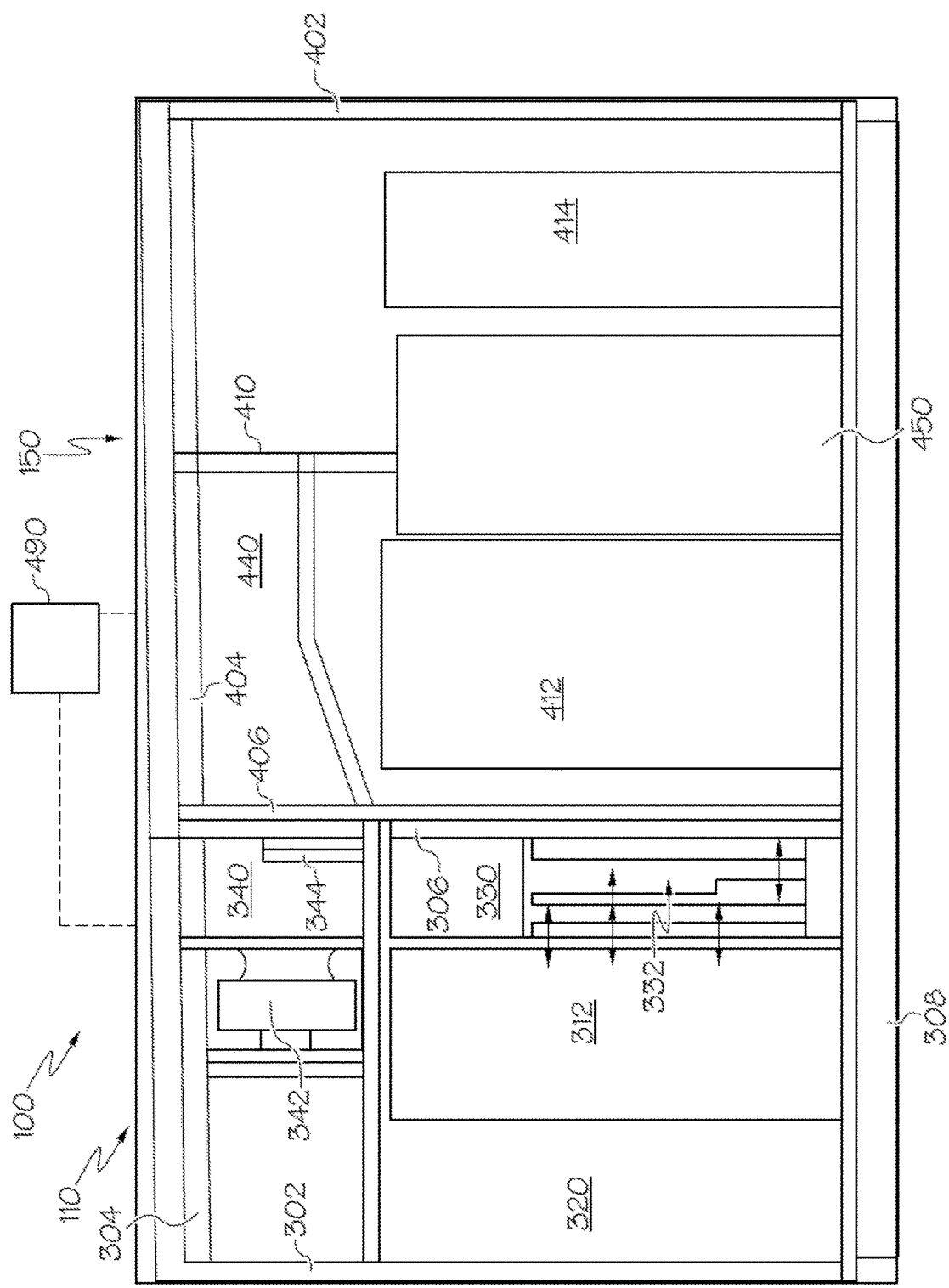
FIG. 4 is a schematic cross-sectional view of the modular data center of FIG. 1 in accordance with an exemplary embodiment.

FIG. 3 is a cross-sectional view through the cooling module 110 and data module 150, and FIG. 4 is a simplified schematic cross-sectional view similar to the view of FIG. 3. A brief introduction of the structure of the cooling module 110 and data module 150 is provided below prior to a more detailed description of the cooperative function of the modules 110, 150.

As shown, the cooling module 110 is defined by a first side wall 302, top wall 304, a second side wall 306, and floor 308. As shown more clearly in FIGS. 1 and 2 and subsequent FIGS, the cooling module 110 is also defined by front and rear exterior walls on each end of the module 110, at least one of which defines an access door to access the interior of the cooling module 110. Generally, the first side wall 302 and top wall 304 are exterior walls, while the second side wall 306 is configured to mate with a similarly configured wall of the data module 150, as discussed in greater detail below. The floor 308 generally forms the base of the cooling module 110, and in one exemplary embodiment, no cooling function associated with the cooling module 110 is located in or below the floor 308.

The exterior walls may include and/or be framed by a frame structure 300 formed by beams or cross-members that support the walls, floor, and internal structure, as appropriate. As described below, the frame structure 300 and/or walls may have mating features such that the cooling module 110 can mate with the data module 150 in a permanent, semi-permanent, or detachable manner as the modules 110, 150 are assembled, e.g., during deployment at the site. Such mating features may include latch assemblies, bolt assemblies, screw assemblies, interlocking assemblies, sealing assemblies, and the like.

The interior of the cooling module 110 may include any number of internal walls, racks, shelves, rails, infrastructure, or interior structure 310 that supports the various types of cooling equipment and/or defines various types of functional areas, as described below. For example, the interior structure 310 may define an aisle 312 that extends lengthwise generally through the center of the cooling module 110 that enables access to the various areas inside the cooling module 110. The aisle 312 is accessible via a door in at least one of the exterior walls. As described below, at least a portion of the interior structure 310 may be considered a partitioning structure that at least partially forms that various flow paths of the cooling air. After an introductory description of the cooling module 110, a more detailed description of the partitions and flow paths will be provided.

The interior structure 310 may further define a first side area 320 that generally houses the valves, pumps, and conduit portions that circulate the chilled water or other coolant for the cooling module 110, as described below. A second side area 330 generally houses the cooling (or cooling coil) units 332 through which air is forced to remove heat, as also described below. As shown, the second side area 330 is on the side of the cooling module 110 immediately adjacent to the data module 150.

The interior structure 310 may further define a return plenum 340 positioned above the first and second side areas 320, 330 and center aisle 312. The return plenum 340 of the cooling module 110 may house one or more fan units 342 that create a pressure differential to circulate air flow. Additionally, the return plenum 340 may include one or more back draft dampers 344 that enable air to flow into the return plenum 340 from the data module 150, but generally prevents air from flowing from the return plenum 340 to the data module 150.

The data module 150 is defined by a first side wall 402, top wall 404, a second side wall 406, and floor 408. As shown more clearly in FIGS. 1 and 2 and subsequent FIGS, the data module 150 is also defined by front and rear exterior walls on each end of the module 150, at least one of which define one or more access doors to access the interior of the data module 150. Generally, the first side wall 402 and top wall 404 are exterior walls, while the second side wall 406 is configured to mate with a similarly configured wall of the data module 150, as discussed in greater detail below. The floor 408 generally forms the base of the data module 150, and in one exemplary embodiment, no cooling or data function associated with the data center 100 is located in or below the floor 408. The data module 150 may further include a frame structure 400 formed by beams or crossmembers that support the walls, floor, and internal structure, as appropriate. Similar to the mating features of the cooling module 110, the data module 150 may have corresponding mating features.

The interior of the data module 150 may include any number of internal walls, racks, shelves, rails, infrastructure, or interior structure(s) 410 that support the various types of cooling equipment and/or defines various types of functional areas, as described below. For example, the interior structure 410 may define first and second aisles 412, 414 that extend lengthwise generally through the center of the data module 150 that enable access to the various areas inside the data module 150. The aisles 412, 414 are accessible via door in at least one of the exterior walls. As described below, at least a portion of the interior structure 410 may be considered a partitioning structure that at least partially forms that various flow paths of the air.

The interior structure 410 may further define a data area 420 that generally houses the data (or IT) cabinets 450. As described in greater detail below, the cabinets house electronic equipment that is cooled by the cooling air circulated by the cooling module 110. In other words, the cooling air flows across the electronic equipment to remove heat, and the heated air is returned to the cooling module 110. The data area 420 extends in between the first and second aisles 412, 414 such that the first aisle 412 on one side of the cabinets 450 may be considered the cold aisle 412 and the second aisle 414 on the other side of the cabinets 450 may be considered the hot aisle 414. The interior structure 410 may further define a return plenum 440 positioned above the aisles 412, 414 and data area 420.

As such, the return plenums 340, 440 are positioned above the cabinets 450 and aisles 312, 412, 414, immediately underneath the top walls. As such, no sub-floor space is necessary.

The data center 100 and/or modules 110, 150 may include controller 490 (or collection of controllers) that generally controls operation of the various components. In various embodiments, controller 490 may execute logic to evaluate conditions and determine instructions for assessing and controlling data center operating conditions. In various embodiments, a data center intelligent control system (a "DCICS") is a computer-based software system that gathers and analyzes data, generates instructions and communicates instructions to the controller. The DCICS optimizes data centers and data center operations by, for example: collecting, monitoring, analyzing, warehousing and mining data; analyzing and predicting using proprietary algorithms, forecasts, simulations, and models to develop alternative data center configurations and processes; optimizing by analyzing a plurality of optimization dimensions and developing and evaluating alternative optimization actions; and generating and implementing optimization instructions. Among other things, the controller may increase and decrease the amount of air circulating through the modules, the temperature of the cooling units, fan speeds, failure modes, and any other parameter in response to various types of information. Generally, the controller 490 may gather information from the various sensors described below, as well as user inputs, and generate commands to implement the appropriate response. Additional information operation of the controller 490 and/or the electrical equipment that make up or form the controller 490 may be found in the applications cited above and incorporated by reference.

The controller 490 can be a machine within which a set of instructions, when executed, may cause the machine to perform any one or more of the methodologies discussed herein. In some embodiments, the machine can operate as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment. The machine may comprise a server computer, a client user computer, a personal computer (PC), a tablet PC, a laptop computer, a desktop computer, a control system, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The exemplary embodiment described herein can utilize various power sources, including backup generators and the like. In one embodiment, solar energy can be utilized as a power source. The power can be based on various voltage sources and can include a medium voltage supply as well as a 480 v supply.

The controller 490 can be in communication with one or more sensors (e.g., any of the sensors described herein) for receiving environmental information associated with the electronic equipment. For example, one or more temperature sensors (described below) and one or more pressure sensors (described below) can be positioned with respect to the electronic equipment so that the sensors can capture environmental information and transmit the information to the controller 490. The particular positioning of the sensors can vary. For instance, temperature sensors can be placed both upstream and downstream of the coil (e.g., units 332) so that the cooling efficiency of the coil can be easily monitored, while other temperature sensors can be placed in close proximity to the electronic equipment so that the amount of heat being generated by the electronic equipment can be more easily monitored. The pressure sensors can be placed both upstream and downstream of the pressurized plenum (e.g., plenum 340, 440), so that the pressure differential can be more easily monitored. The type of sensor used to capture the environmental information can also vary, including pressure and temperature transducers and thermocouples.

In one embodiment, other sensors can also be used to further monitor the environmental conditions associated with the electronic equipment, such as humidity sensors and flow sensors. The humidity sensors allow the controller 490 to monitor the humidity that the electronic equipment is being exposed to and to adjust the humidity accordingly, such as through use of a de-humidifier that is in fluid communication with the electronic equipment. The flow sensors allow the controller 490 to monitor the flow rate of air, such as for determining heat transfer via convection. The use of flow sensors can also be used for determining other environmental characteristics, such as air flow turbulence, that can have an adverse impact on the cooling of the electronic equipment or the equipment itself.

The sensors can communicate with the controller 490 via hardwire (e.g., cables) and/or wireless links. The particular communication protocols that are utilized can vary and can include Wireless Fidelity or WiFi services, Bluetooth, GSM, CDMA, UMTS, WiMAX, and so forth. A combination of communication techniques can also be utilized, such as allowing the sensors to communicate both wirelessly and via hardwire to provide redundancy so that data is not lost in the event of a link failure.

The controller 490 can receive the environmental information from the sensors and adjust the environmental conditions accordingly. In one embodiment, each of the cabinets 450 can have a range of environmental conditions that are acceptable. In real time, the controller 490 can receive the environmental information associated with each of the cabinets 450 and then in real time can adjust one or more of the temperature, pressure and humidity associated with the cabinets.

For example, the controller 490 can determine that a first cabinet 450 needs to lower its temperature by a desired amount. The controller 490 can then transmit control signals for making the appropriate adjustment to achieve the desired temperature change. For instance, the controller 490 can transmit a control signal to the cooling module 110 to increase coolant flow to the coil that is associated with the particular cabinet or to decrease the temperature of the coolant that is being provided to the coil. In one embodiment, the controller 490 can transmit a control signal to the cooling module 110 which designated a desired temperature and the subsystem can then implement the necessary steps to achieve the desired temperature. As another example, the controller 490 can transmit a control signal to the pressurized plenum that is associated with the particular cabinet so that the pressure differential is increased thereby increasing the air flow through the particular cabinet. In one embodiment, the controller 490 can independently utilize the pressurized plenum and the cooling module 110 to adjust the temperature associated with a particular cabinet. In another embodiment, the controller 490 can utilize both of the pressurized plenum and the cooling module 110 to adjust the temperature associated with a particular cabinet.

As another example, the controller 490 can determine that a first cabinet 450 needs to decrease its air flow rate through the cabinet 450 a desired amount. The controller 490 can then transmit control signals for making the appropriate adjustment to achieve the desired air flow rate. For instance, the controller 490 can transmit a control signal to the pressure source of the pressurized plenum to decrease the pressure within the plenum that is associated with the particular cabinet. In one embodiment, the damper positioned downstream of the pressurized plenum may be opened or closed using an actuator (e.g., a servo-motor or other movable control device). In this example, the controller 490 can restrict air flow to the particular cabinet by sending control signals to the actuator which results in the damper moving towards a closed position.

Controller 490 can also utilize historical information to provide environmental management for the cabinets 450. For example, the controller 490 can monitor the temperature of particular cabinets based on particular times of the day and adjust the environmental conditions of the cabinets in anticipation of those temperatures. For instance, historical data may show that electronic equipment in a particular cabinet is typically being used to capacity during the morning with a resulting elevation of cabinet temperature during those morning hours. The controller 490 can adjust the temperature in the particular cabinet to a lower portion of the desired range in anticipation of the increased temperature in the morning. The historical data can be maintained in a memory of the controller 490 or can be stored elsewhere and retrieved by the controller 490.

Controller 490 can also maintain historical information associated with the efficiency of the thermal control being implemented by the controller. For example, the controller 490 can implement several different techniques for achieving a desired environmental condition and compare the techniques to determine which was the most efficient. For instance, where a temperature decrease is needed, the controller 490 can on a first occasion utilize an increase in pressure differential to achieve the lower temperature. On a second occasion, the controller 490 can utilize the cooling module 110 to achieve the lower temperature. The controller 490 can then determine efficiency based on such factors as the amount of time needed to achieve the lower temperature, the amount of power utilized in achieving the lower temperature and so forth. In this example, the controller 490 can then utilize this historical information to determine which thermal management techniques should be utilized in the future based on the particular circumstances.

In one embodiment, other factors can also be analyzed by the controller 490 for determining the particular technique to utilize to achieve the desired environmental condition. For instance, vibration or noise can be monitored with respect to the use of certain components of the system 100 and the amount of vibration or noise can be a factor in determining which technique (e.g., which cooling components) should be utilized.

Figure 5:
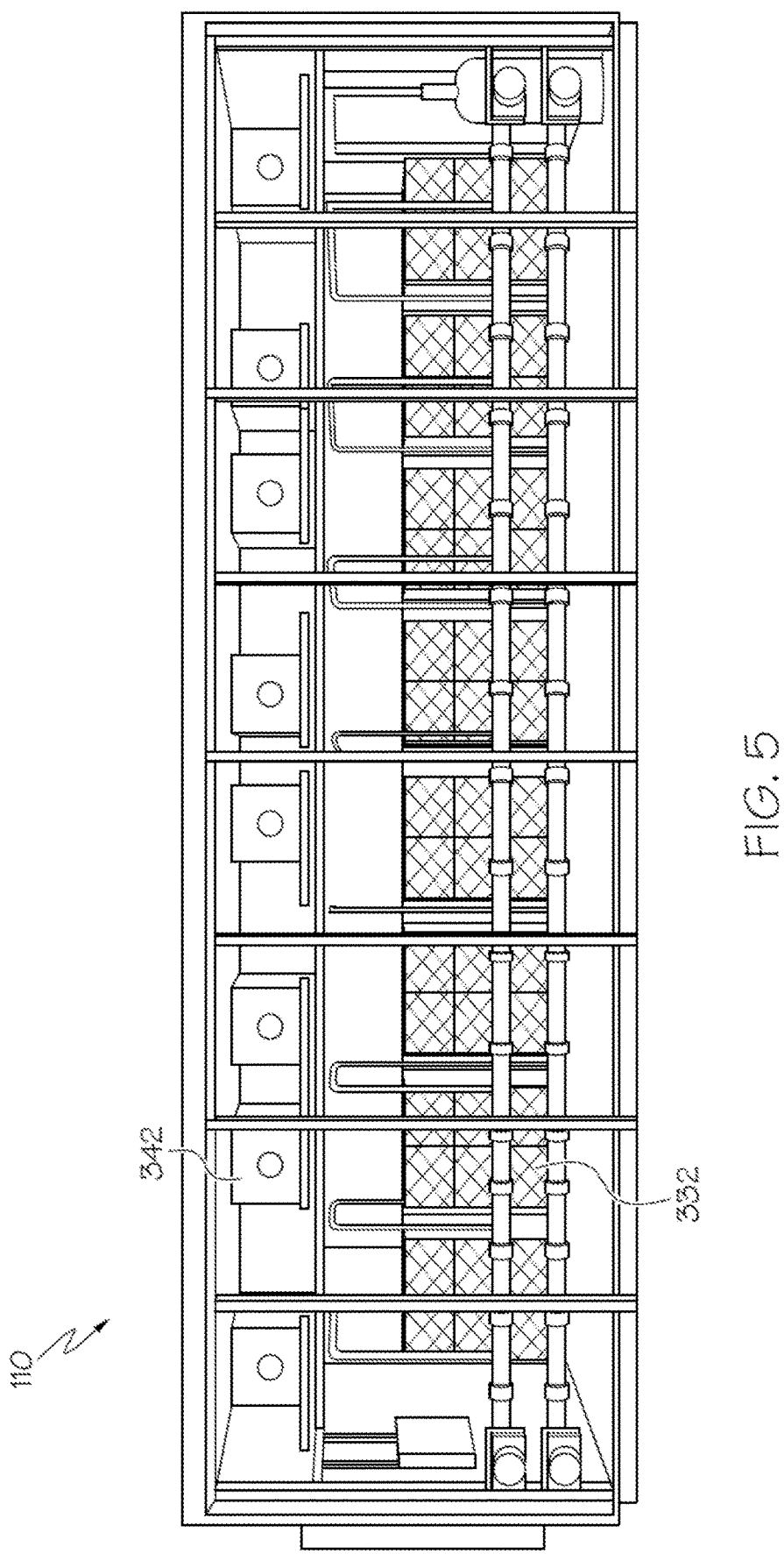
FIG. 5 is a side view of the modular data center of FIG. 1 in accordance with an exemplary embodiment.

FIG. 5 is a side view of the cooling module 110. As shown, the cooling module 110 may include a series of cooling units 332 and fan units 342. In the depicted exemplary embodiment of FIG. 5, the cooling module 110 includes eight (8) cooling units 332 and eight (8) fan units 342. As such, in one exemplary embodiment, the ratio of cooling units to fans is 1:1. Other numbers and/or other ratios of cooling units 332 and fan units 342 may be provided, as described in greater detail below.

Figure 6:
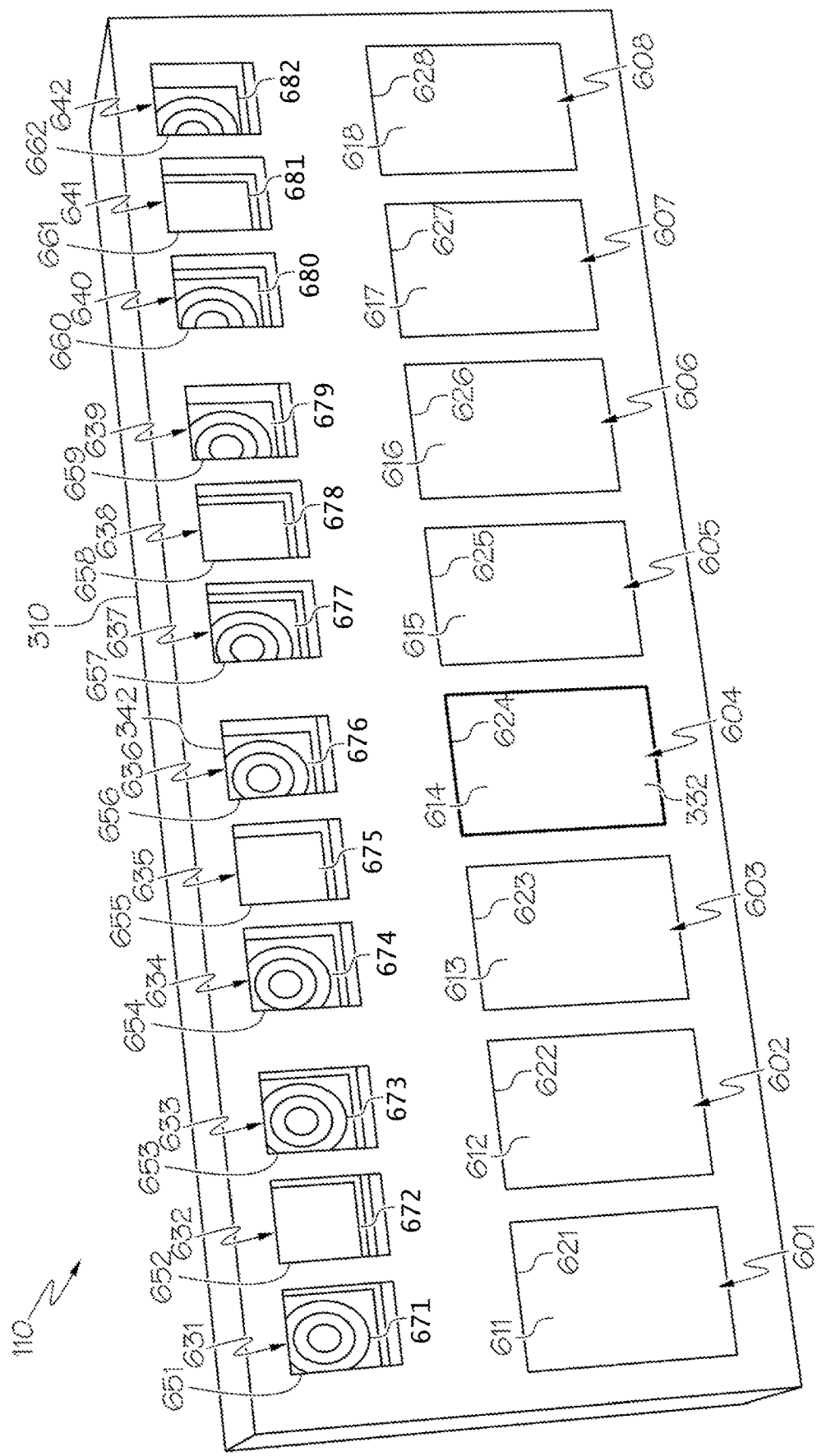
FIG. 6 is a side view of a cooling module the modular data center of FIG. 1 in accordance with an exemplary embodiment.
Figure 7:
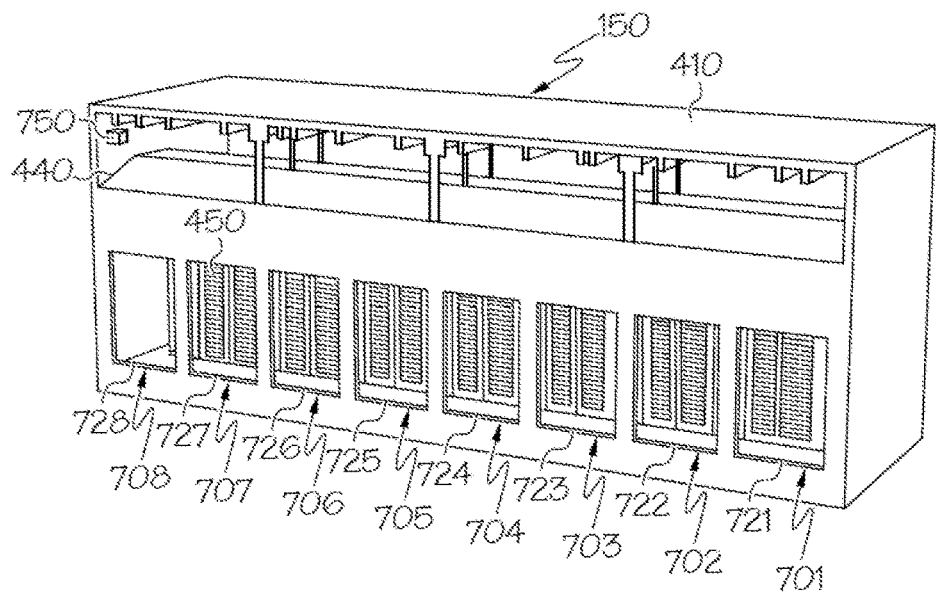
FIG. 7 is a side view of a data module of the modular data center of FIG. 1 in accordance with an exemplary embodiment.

FIGS. 6 and 7 are views of the respective side walls 306, 406 of the cooling module 110 and data module 150 demonstrating the cooperative nature of the modules 110, 150 that form the data center 100. The side walls 306, 406 may also be referred to as interface walls that mate together in the manner described below.

In particular, FIG. 6 depicts the interior structure 310 of the cooling module 110 that houses the cooling units 332 and fan unit 342, as well as partially defines the return plenum 340. As particularly shown in FIG. 6, the interior structure 310 of the cooling module 110 may be considered a partitioning structure that defines the individual and collective flow paths for various areas of the data center 100. FIG. 6 depicts one exemplary arrangement for delivering the side cooling flow of air to the cabinets 450 of the data module 150. In this exemplary embodiment, the interior structure 310 may define a number of supply partitions 601-618. Each supply partition 601-608 houses one of the cooling units 332 and forms a supply channel 611-608, and each supply channel 611-618 forms a supply opening 621-628 at the interface side wall 306. Generally, each supply channel 611-618 is fluidly isolated from other supply channels 611-618 within the interior of the respective supply channel 611-618. This enables a higher level of control with respect to air flow characteristics. Although eight (8) supply partitions 601-608 are depicted in this embodiment, additional or fewer supply partitions 601-608 may be provided. Additionally, although each supply partition 601-608 in this embodiment is associated with a cooling unit 332, in further embodiments, one or more of the supply partitions 601-608 may not include a cooling unit. This may be applicable, for example, when cooling air is not necessary for certain portions of the data module 150. However, since the supply partitions 601-608 are generally isolated from one another, the operating cooling units 332 may be able to deliver the desired amount of cooling air without pressure loses resulting from the "unused" areas of the cooling module 110.

As also shown in FIG. 6, supply partitions 601-608 (and thus, the supply channels 611-618, supply openings 621-628, and cooling units 332) are arranged in a horizontal row that extends along a longitudinal orientation of the cooling module 110. This results in the cooling air from each cooling unit 332 being directed in a primarily lateral direction.

The interior structure 310 further defines a number of return partitions 631-642. Each return partition 631-642 may define a return channel 651-662, each of which in turn defines a return opening 671-682 in the interface side wall 306. A fan unit 342 is arranged in one or more of the return channels 651-662. Generally, the return channels 651-662 may be fluidly isolated from one another along the interior. Although twelve (12) return partitions 631-642 with eight (8) fan units 342 are depicted in this embodiment, additional or fewer supply partitions 601-608 and fan units 342 may be provided.

In this embodiment, the return partitions 631-642 are arranged above the supply partitions 601-608. In some embodiments, the number of return partitions 631-642 and the number of supply partitions 601-608 may be predetermined to provide advantageous flow characteristics. In the depicted embodiments, the ratio of return partitions 631-642 to supply partitions 601-608 is approximately 1.5:1, although other ratios may be provided, including 1:1, less than 1:1, greater than 1:1, and greater than 1.5:1. Similarly, in some embodiments, the number of fan units 342 and the number of supply partitions 601-608 (or number of cooling units 332) may be predetermined to provide advantageous flow characteristics. In the depicted embodiment, the ratio of fan units 342 to supply partitions 601-608 (or cooling units 332) may be 1:1, although greater than 1:1 or less than 1:1 may also be provided.

FIG. 7 depicts one example of the interior structure 410 of the data module 150 that houses the cabinets 450 for the electronic equipment and at least partially defines the return plenum 440.

As particularly shown in FIG. 7, the interior structure 410 of the data module 150 may be considered a partitioning structure that defines the individual and collective flow paths for various areas of the data center 100. FIG. 7 depicts one exemplary arrangement for receiving the side cooling flow of air from the cooling module 110 and delivering it to the cabinets 450. In this exemplary embodiment, the interior structure 410 may define a number of supply partitions 701-708. The supply partitions 701-708 may define supply openings 721-728 in the interface side wall 406. In some embodiments, the supply openings 721-728 may be considered supply channels.

Generally, each supply opening 721-728 in the data module 150 is sized and arranged to match a corresponding supply opening 621-628 in the cooling module 110. This enables an efficient and effective cooperative mechanism for receiving and delivering the horizontal air flow from the cooling module 110. As such, the data module 150 and cooling module 110 generally have the same number of supply openings 621-628, 721-728.

The interior structure 410 may further define the return plenum 440. Upon assembly of the data center 100, the outlet of the return plenum 440 in the interface wall 406 of the data module 150 mates with the return openings 671-682 to create a portion of the flow path between the data module 150 and the cooling module 110.

In this exemplary embodiment, the return plenum 440 is a common plenum. However, in other embodiments, the interior structure 410 may subdivide the return plenum 440 into a number of individual return plenum channels that individually mate with corresponding return openings 671-682 of the cooling module 110. As also shown in FIG. 7, the data module 150 may include a makeup air vent 750 that is fluidly coupled to an exterior wall to provide additional air into the data center 100.

The interior structure 410 may also define the various areas or sections of the data module 150. In particular, the interior structure 410 may define the cold aisle, data cabinet housings, and the hot aisle, as described above. In the depicted exemplary embodiment, the data module 150 includes twenty 20 cabinets, each having 25 kW equipment. Other embodiments may have fewer or additional cabinets and/or different arrangements or sizes of cabinets.

Figure 8:
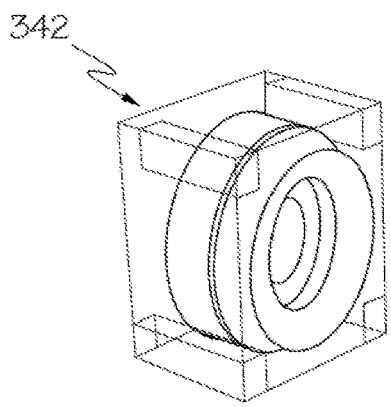
FIG. 8 is an isometric view of a fan unit of the cooling module of FIG. 6 in accordance with an exemplary embodiment.
Figure 9:
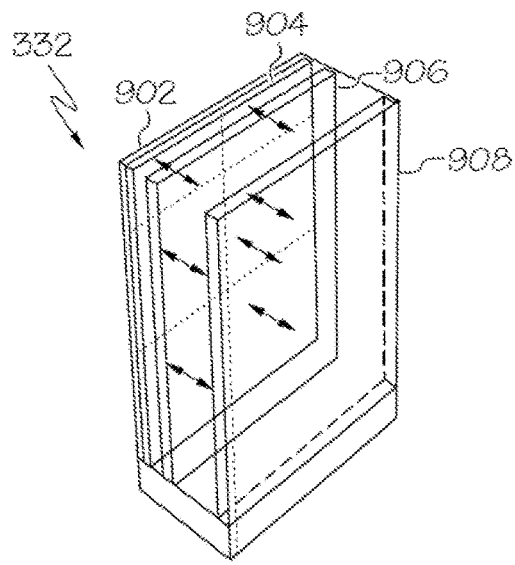
FIG. 9 is an isometric view of a cooling unit of the cooling module of FIG. 6 in accordance with an exemplary embodiment.
Figure 10:
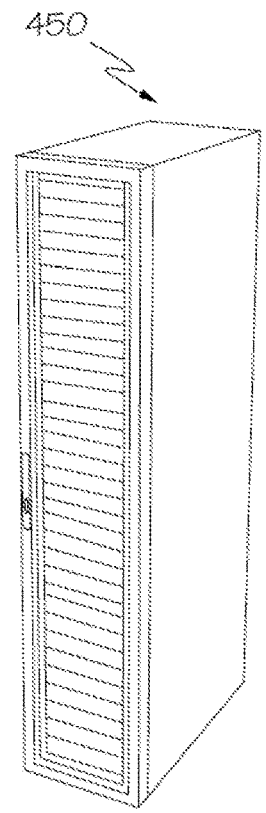
FIG. 10 is an isometric view of a cabinet of the data module of FIG. 7 in accordance with an exemplary embodiment.

FIG. 8 is an isometric view of one of the fan units 342. FIG. 9 is an isometric view of one of the cooling units 332. As shown, each cooling unit 332 may include a filter 902, a sensible coil 904, a latent coil 906, and a mist eliminator 908. Generally, the latent coil 906 is used for dehumidification and the sensible coil 904 is used for cooling, such that, in combination, appropriate cooling air characteristics may be achieved. These components are layered together to sequentially condition and cool the air as it flows through the supply channel (e.g., supply channel 611-618). As described below, the cooling units 332 are coupled to cooling supply and return conduits to circulate coolant (e.g., chilled water). FIG. 10 is an isometric view of one of the cabinets 450 that house the data equipment in the data module 150.

Figure 11:
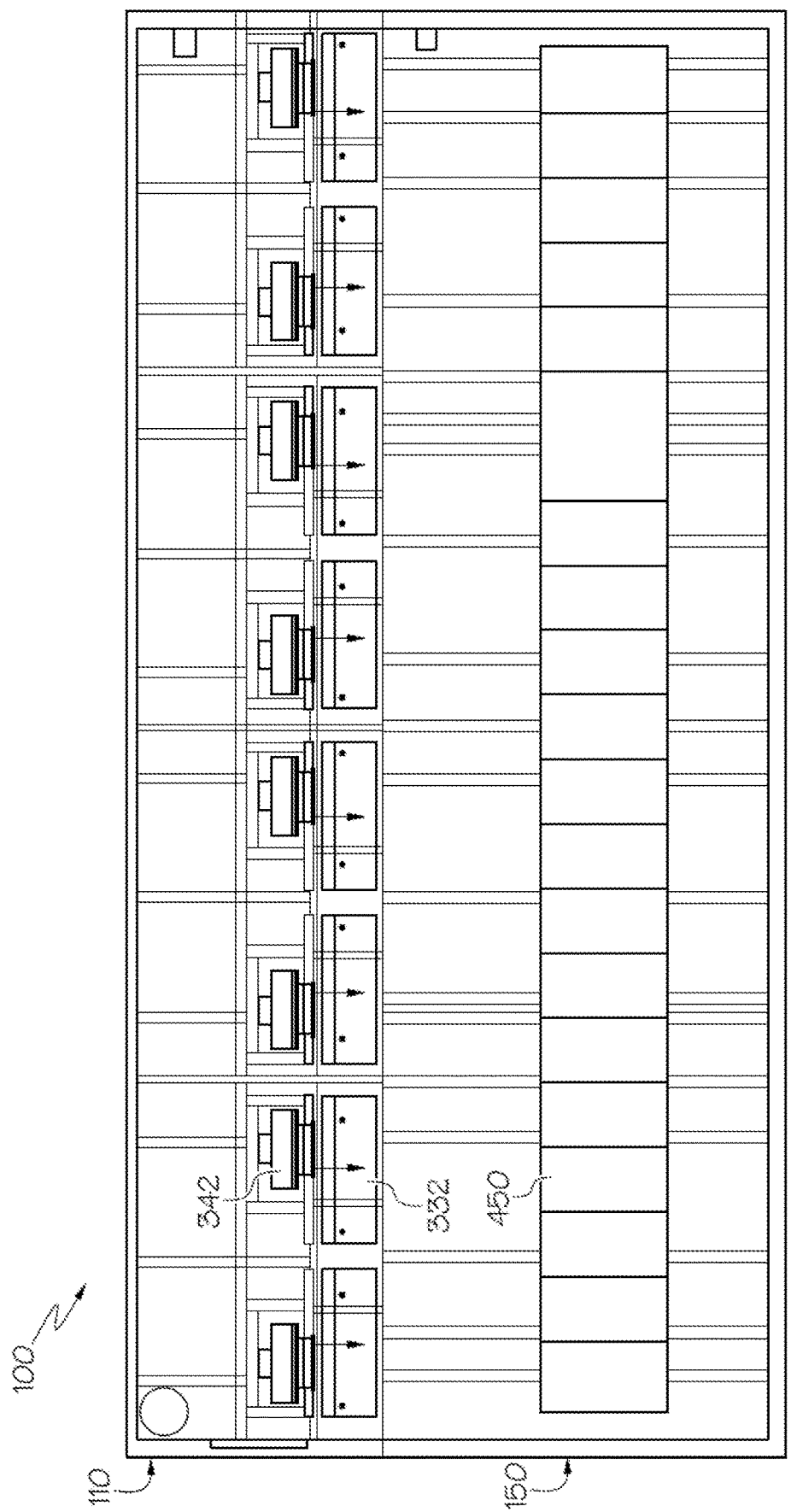
FIG. 11 is a schematic top view of the data center of FIG. 1 in accordance with an exemplary embodiment.

FIG. 11 is a schematic top view of the data center 100 depicting the relative positions of the cooling module 110 and data module 150. In particular, FIG. 11 depicts the relative positions of the cooling units 332, fan units 342, and cabinets 450.

Figure 12:
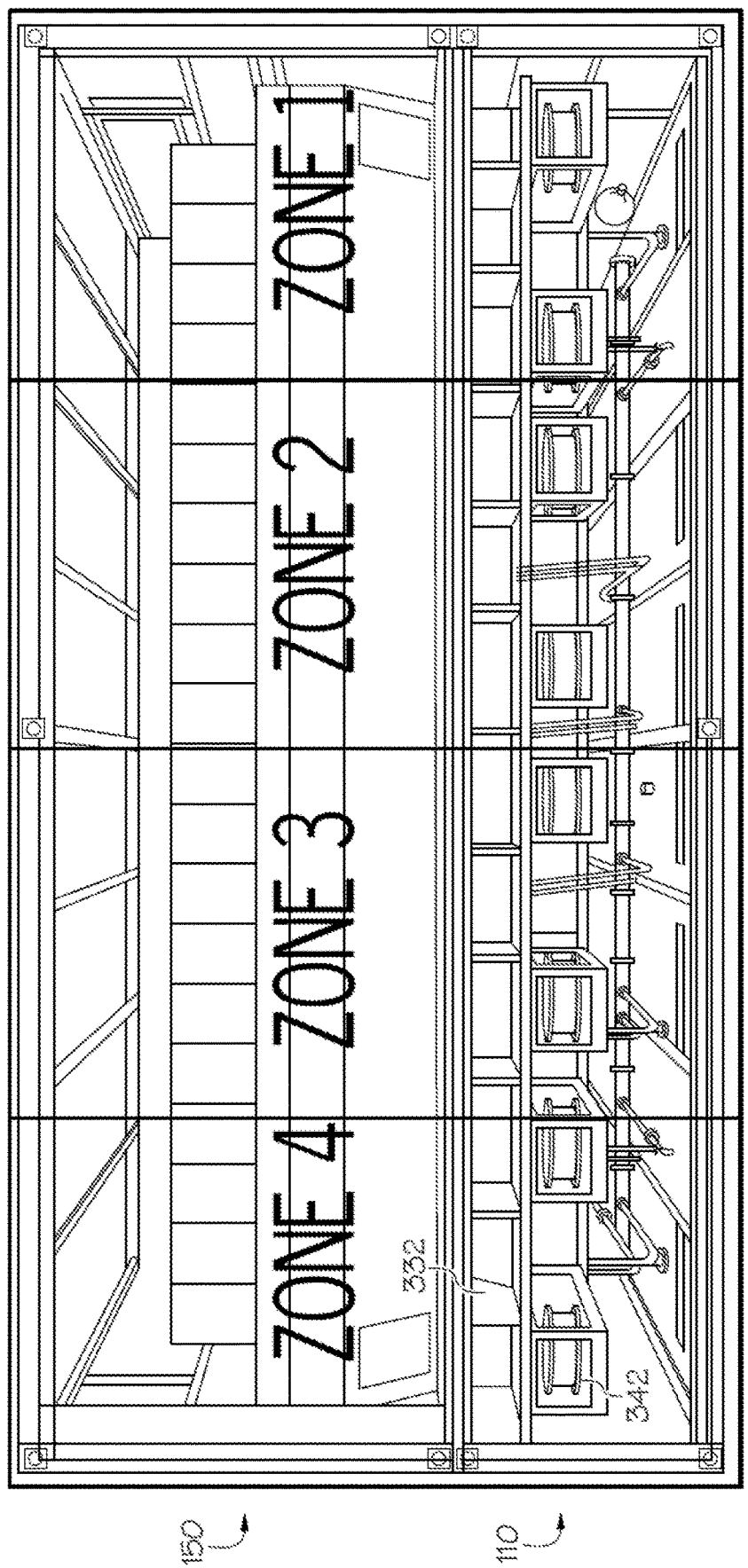
FIG. 12 is another top view of the data center of FIG. 1 depicting zones in accordance with an exemplary embodiment.

In some exemplary embodiments, the data center 100 may be considered, evaluated, and/or controlled by the controller 490 in zones that enable independent or partial operation. For example, as shown in FIG. 12, four (4) zones may be considered along the length of the data center 100, such that each zone extends across the width of the data center 100 to include a portion of the cooling module 110 and the data module 150. In this configuration, each zone may include two cooling units 332, two fan units 342, and five cabinets 450. Other configurations may be provided.

Figure 13:
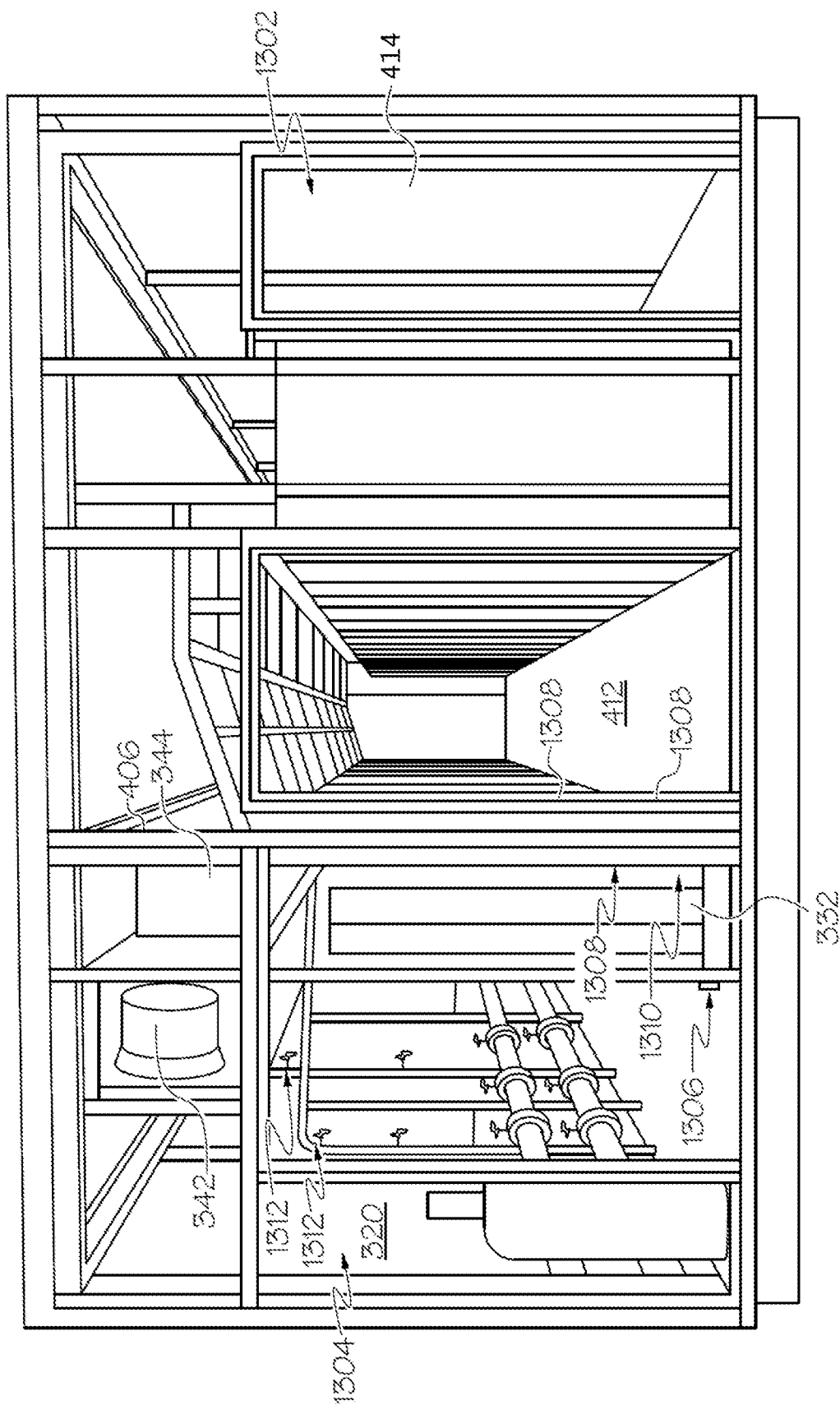
FIG. 13 is an end view of the data center of FIG. 1 in accordance with an exemplary embodiment.

Each zone may have a particular number or set of sensors that enable independent operation of the zone. One such arrangement is shown in FIG. 13, which is a cross-sectional view across an exemplary zone that depicts the various types of sensors that may be provided in a respective zone. For example, each zone may include a hot aisle temperature sensor 1302 positioned in the hot aisle 414, a temperature sensor 1304 positioned in the first area 320 of the cooling module 110, and a leak detector 1306 at or proximate to the cooling units 332. Further, a sensible temperature sensor 1308, a latent temperature sensor 1310 and a water temperature sensor 1312 may be provided for each of the two cooling units 332 of the zone. Similarly, a differential pressure sensor, a fan power status sensor, a fan demand position sensor, and a fan feedback position sensor may be provided for each of the two fan units 342. Although not specifically shown in FIG. 13, additionally, each of the one of more control values positioned within the first area 320 may be provided with a feedback position sensor and a demand position sensor. Other sensor arrangements may be provided, and additional details about the various sensors are provided below.

FIGS. 14 and 15 are top and side views, respectively, of the data center 100 showing the positions of various types of additional sensors. The sensors in FIGS. 14 and 15 may be considered center or system-level sensors. As examples, FIGS. 14 and/or 15 depict the position of following sensors: one (1) outside temperature sensor 1402 on an exterior wall of the cooling module 110; three (3) humidity sensors, including one outside humidity sensor 1404 on or near an exterior wall of the cooling module 110, one humidity sensor 1406 in the first area 320 of the cooling module 110, and one humidity sensor 1408 in the return plenum 440 of the data module 150; three (3) differential pressure sensors, including one 1410 between the hot aisle 414 and the return plenum 440 of the data module 150, one 1412 between the return plenum 440 of the data module 150 and the cooling module 110, and one 1414 between the cooling module 110 and the outside atmosphere; and two (2) chilled water temperature sensors 1416, 1418, including one at either end of the first area of the cooling module 110. Further the sensors may include five (5) door position sensors; ten (10) breaker status/REPO sensors; four (4) power status sensors; two (2) humidifier status/setpoint sensors; three (3) make-up air damper status/position sensors; and four (4) fire panel alarm sensors. Other sensors and sensor arrangements may be provided.

Figure 16:
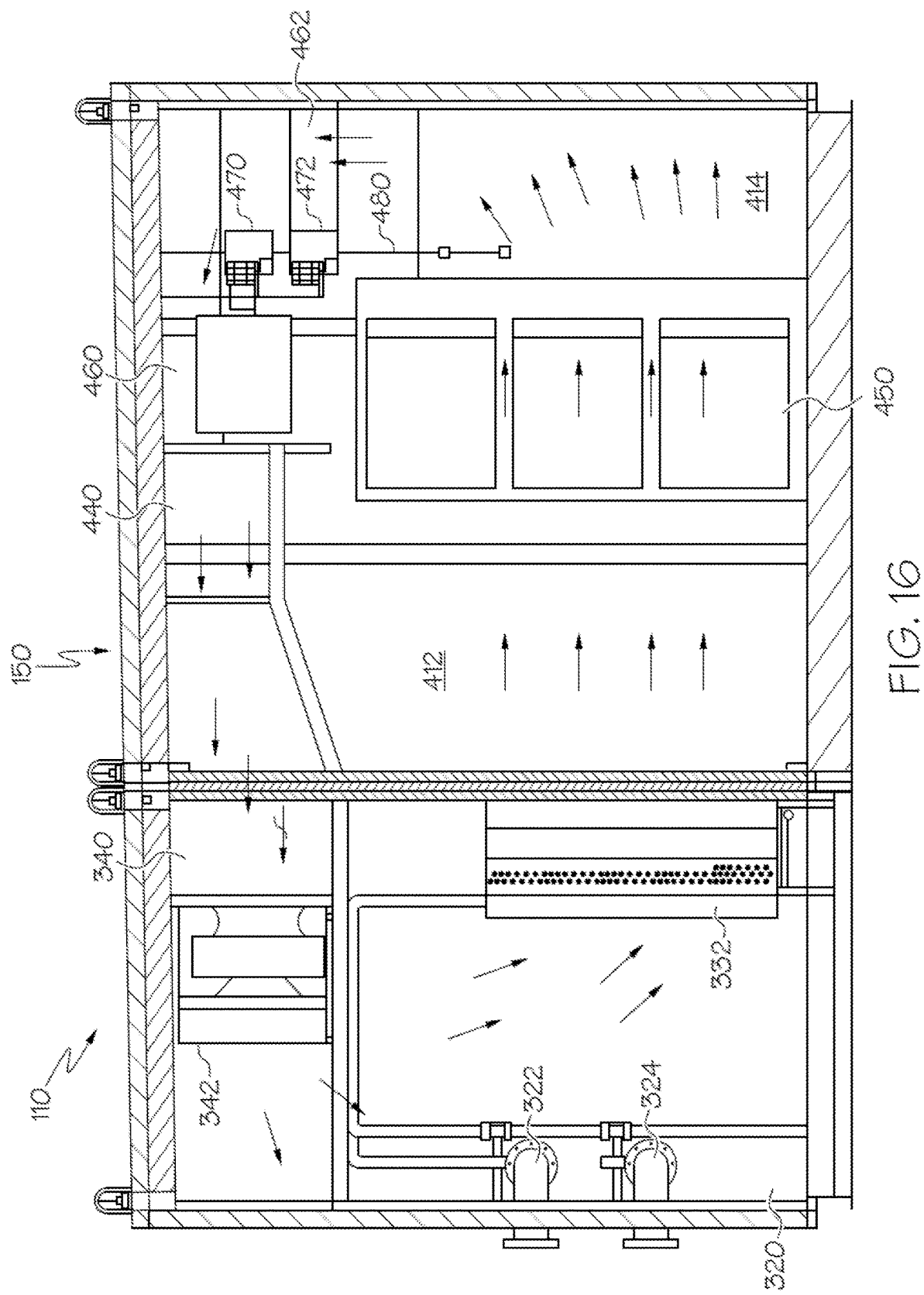
FIG. 16 is a schematic cross-sectional view of the data center of FIG. 1 depicting air flow in accordance with an exemplary embodiment.

FIG. 16 is a schematic cross-sectional view depicting various aspects of the data center 100, some of which have been discussed above. FIG. 16 additionally depicts the air flow patterns throughout the center 100.

In particular, FIG. 16 depicts the position of the fan unit 342 within the return plenum 340 of the cooling module 110. The cooling unit 332 is depicted within the respective partition. A supply header 322 and a return header 324 are mounted in the cooling module 110 for circulating coolant through the cooling units 332. In the data module 150, the return plenum 440 extends from the hot aisle 414 of the data module 150 to the cooling module 110.

FIG. 16 further depicts the position of the data cabinets 450 in the data module 150 and tap boxes 460, 462 generally above the data cabinets 450 of the data module 150. First and second bus plugs 470, 472 are provided in the data module 150 to enable electrical couplings to the busways 480, as described in greater detail below. Generally, the bus plugs 470, 472 and busways 480 enable data and power couplings to the data equipment.

As noted above, FIG. 16 generally depicts the direction of air flow through the modules 110, 150. As shown, cooled air from the cooling units 332 flows from the cooling module 110 into the cold aisle 412 of the data module 150. The air from the cold aisle 412 flows across the data cabinets 450, removing heat from the cabinets 450, and into the hot aisle 414. The air flows from the hot aisle 414 into the return plenum 440 of the data module 150 and into the return plenum 340 of the cooling module 110 as a result of the pressure differential generated by the fan units 342, which circulates the air back through the cooling units 332 to continue the cooling process. The air may be cooled by the cooling units 332 and/or mixed with ambient air in the return plenum 440 to generally condition the air, as appropriate, for effective heat removal at the cabinets 450. Accordingly, during operation, the controller 490 monitors various operational and environmental parameters and generates commands in response to adjust or maintain an acceptable temperature for the data cabinets 450 and/or the other portions of the data center 100. Any aspect of the data center 100 may be subject to adjustment, individually or collectively, including the cooling units 332 and fan units 342, as well as various dampers, doors, valves, and the like that may impact temperature characteristics.

Figure 17:
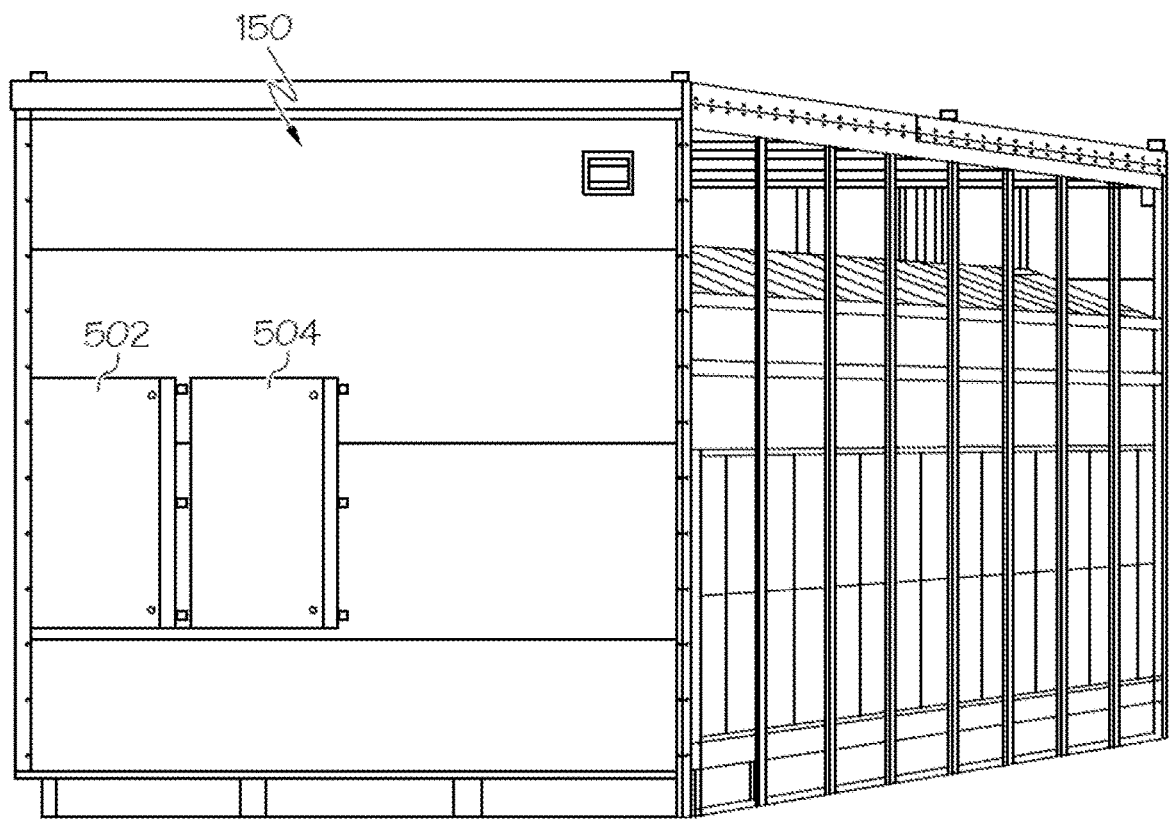
FIG. 17 is an end view of the data center of FIG. 1 in accordance with an exemplary embodiment.
Figure 18:
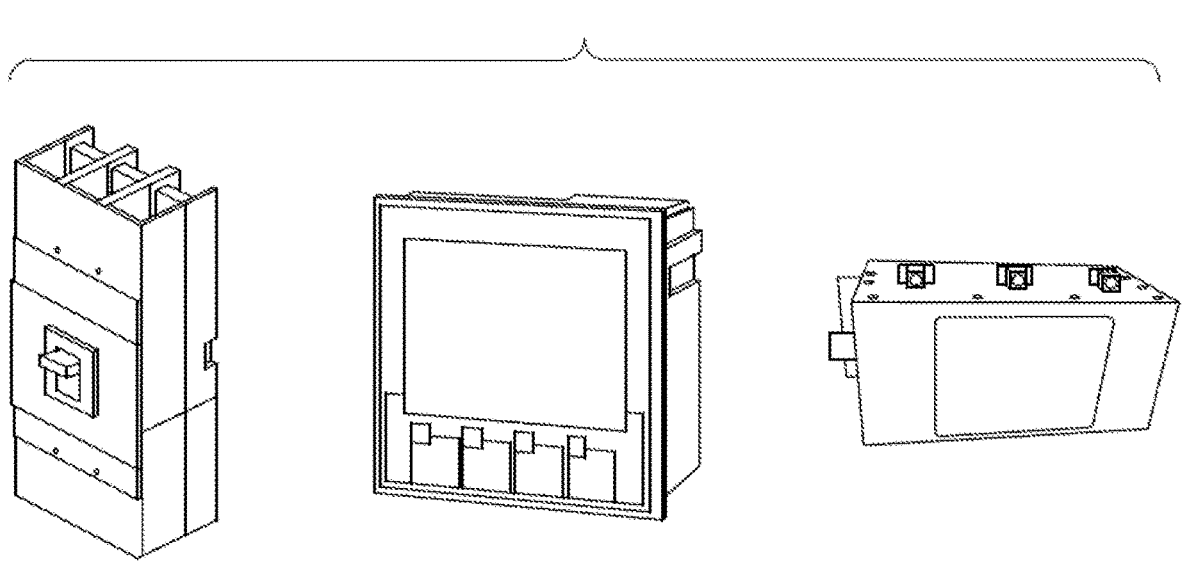
FIG. 18 are isometric views of components incorporated into the data center of FIG. 1 in accordance with an exemplary embodiment.

FIGS. 17-24 generally depict aspects of the electrical system that support operation of the data center 100. For example, FIG. 17 is an external view of the data module 150 and particularly shows enclosures 502, 504 that house various components. The enclosures 502, 504 are mounted on one of the exterior walls of the data module 150 to enable access by a technician or operator, e.g., via removable doors. FIG. 18 depicts the components that may be incorporated into each enclosure 502, 504, including a breaker unit, a meter, and a surge protection device. As noted above, tap boxes (e.g., tap boxes 460, 462) are coupled to the enclosures 502, 504, respectively, via a NEMA 4 wire-way, three 300 MCM per phase connection, a 300 MCM neutral connection, and a I/O AWG ground. Other connection arrangements or sizes may be provided.

Figure 19:
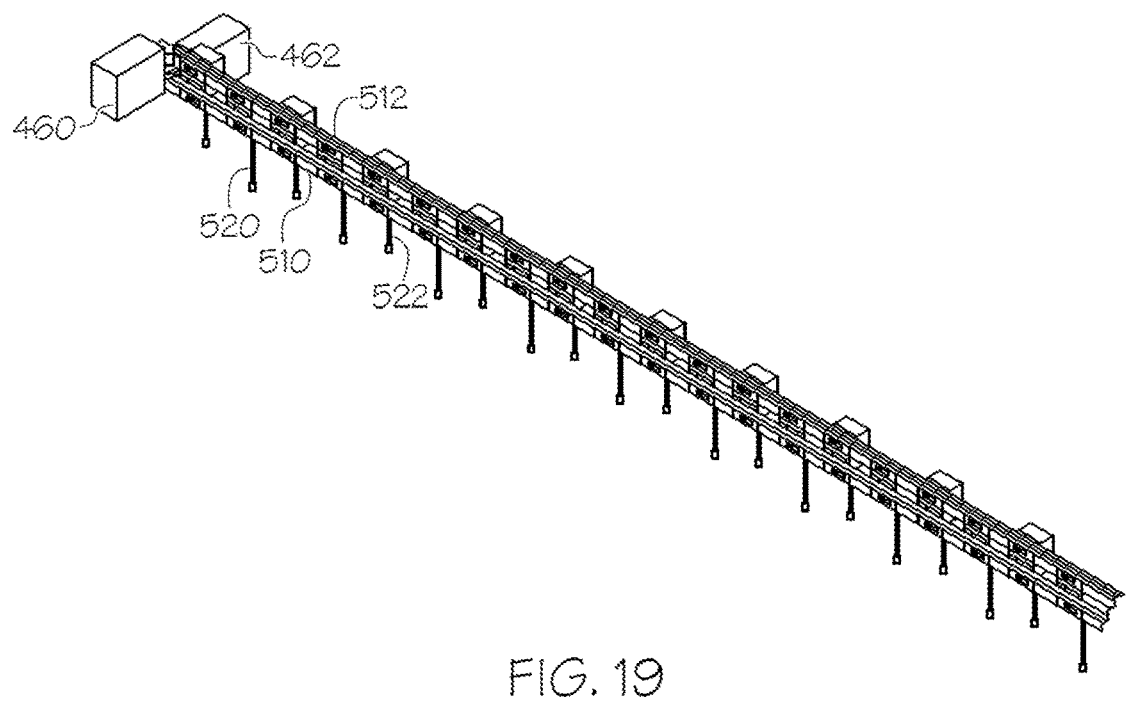
FIG. 19 is an isometric view of busways incorporated into the data center of FIG. 1 in accordance with an exemplary embodiment.

FIG. 19 is an isometric view of the busways 510, 512, each respectively extending from one of the tap boxes 460, 462. Each of the busways 510, 512 supports a number of bus plugs 520, 522. In one exemplary embodiment, each busway 510, 512 may support a bus plug 520, 522 approximately every two feet, thereby resulting in up to 20 bus plugs for each busway 510, 512 in this exemplary embodiment.

Figure 20:
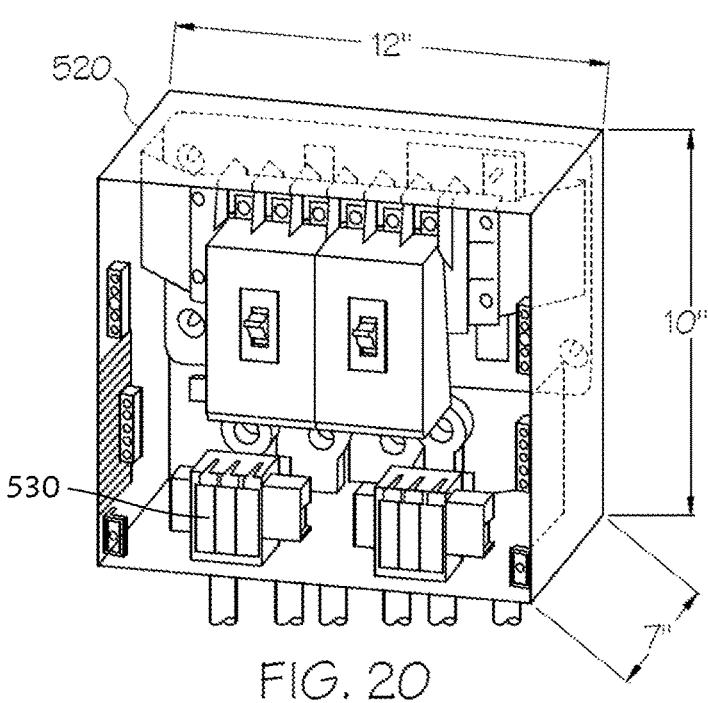
FIG. 20 is a view of bus plugs incorporated into the data center of FIG. 1 in accordance with an exemplary embodiment.

FIG. 20 is an example of one of the bus plugs 520 (or 522). As shown, the bus plug may include one or more meter modules 530 arranged in racks that monitor the branch circuits for the respective plugs. In the depicted embodiment of FIG. 20, three meter modules 530 are arranged in each of two meter racks.

Figure 21:
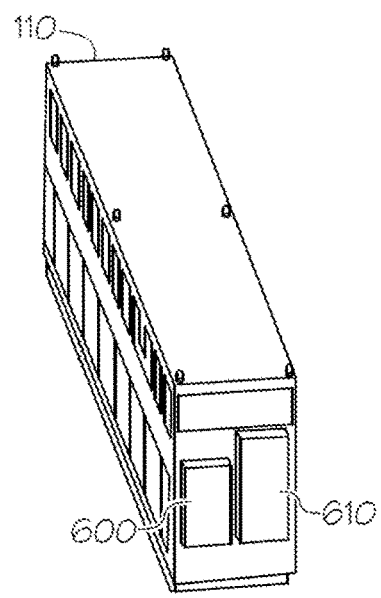
FIG. 21 is an isometric external view of the data center of FIG. 1 in accordance with an exemplary embodiment.

FIG. 21 is an external view of the cooling module 110 and particularly depicts the position of a telemetry box 600 positioned on an exterior wall. The telemetry box 600 may be configured to house various components for communicating with and/or operating the cooling module 110. Exemplary components may include an MCU, a PLC, various I/O cards, a firewall, and a switch.

FIG. 21 further depicts the position of a control panel box 610 positioned on an exterior wall. The control panel box 610 may be configured to house various components for operating the cooling module 110, including breakers, bus bars, breakers, transformers, potentiometers, and mode switches for the fan banks.

Figure 22:
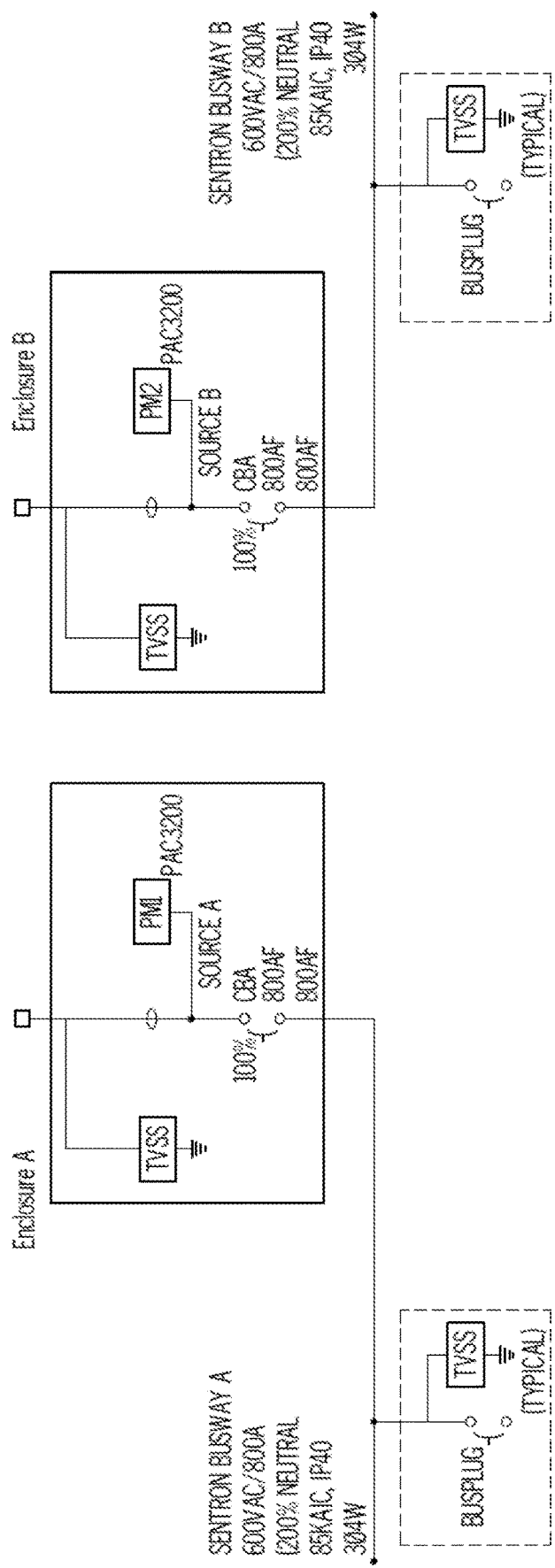
FIG. 22 is a first simplified circuit diagram for providing electrical power from a power source for the data center of FIG. 1 in accordance with an exemplary embodiment.
Figure 23:
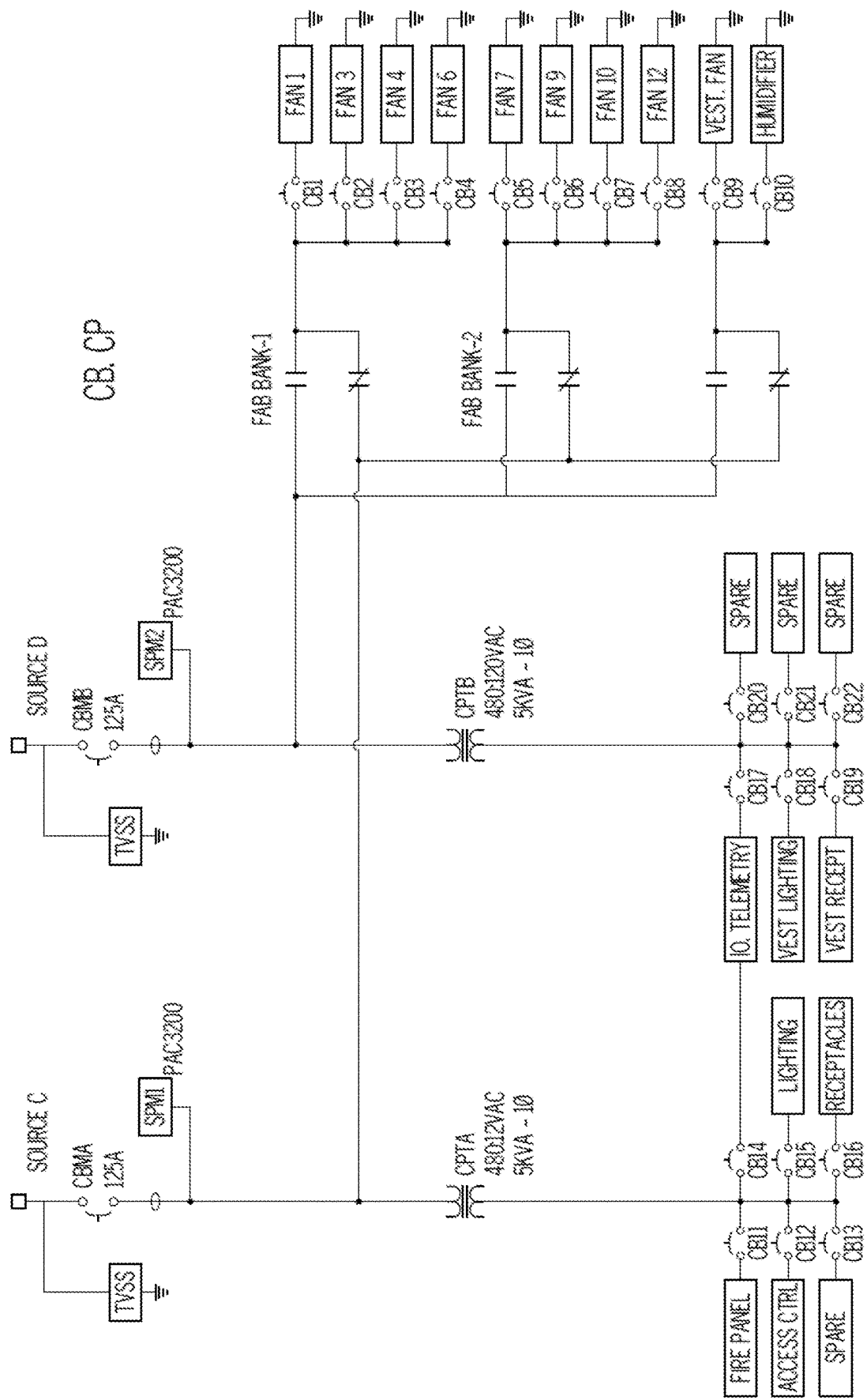
FIG. 23 is a second simplified circuit diagram for providing electrical power from a power source for the data center of FIG. 1 in accordance with an exemplary embodiment.

FIG. 22 is a simplified circuit diagram for providing electrical power from a power source through the respective enclosures 502, 504 to the bus plugs 520, 522 via the busways 510, 512. FIG. 23 is a simplified circuit diagram for providing electrical power to the components of the cooling module 110.

Figure 24:
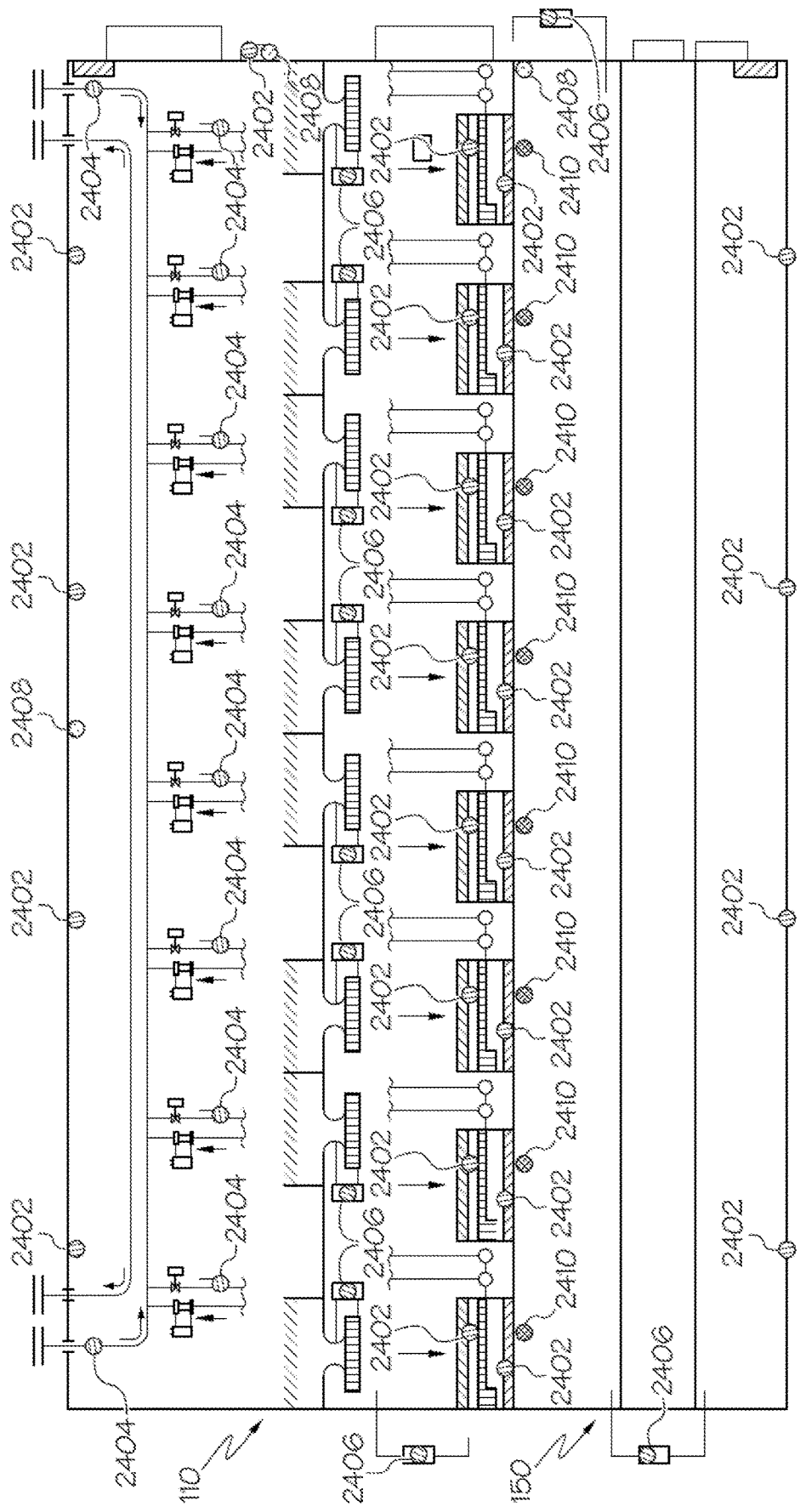
FIG. 24 is a schematic top cross-sectional view of the data center of FIG. 1 depicting the general position of various types of sensors in accordance with an exemplary embodiment.

FIG. 24 is a schematic top cross-sectional view of the data center 100 depicting the general position of various types of sensors, some of which have been introduced above. In one exemplary embodiment, the center 100 includes air temperature sensors 2402, water temperature sensors 2404, differential pressure transmitters 2406, humidity sensors 2408, and leak detectors 2410.

Generally, the center 100 may include a number of components for operation of the center, including various telemetry and bus plug components that are coupled to a main bus plug. Such components and characteristics are monitored with a meter. Each meter may monitor one or more of voltage phase, current, frequency, total active power, total reactive power, total apparent power, total power factors, total kWH, fan CFM, coil water flow, and power usage effectiveness. Such monitoring may be implemented by direct or virtual sensors.

FIG. 25A-25G is a chart that lists exemplary sequences of operation. Other sequences may be provided. As shown in FIG. 25A-25G, a system startup sequence may preceded by hardware pre-startup settings and OS pre-startup settings. FIG. 25A-25G also lists automatic normal operation condition sequences, including sequences for fan operation and coil operation. FIG. 25A-25G further lists the operation sequences for each of the zones. Finally, FIG. 25A-25G lists the sequences upon encountering a failure scenario.

FIGS. 26 and 27 provide exemplary module configurations for combination of cooling modules 110 and data modules 150, as described above. Other configurations are contemplated. For example, the number of air modules and data modules can be increased or decreased depending on the amount of cooling required by IT equipment. In some embodiments, the cooling and data modules 110, 150 may be deployed with and/or integrated with a power module configured to supply power to either or both modules 110, 150. As shown, the modules 110, 150 (and power module, if applicable) may have common exterior dimensions to appropriately join together as a comprehensive center.

Accordingly, in one exemplary embodiment, the data center includes one or more outdoor deployable modules that provides the infrastructure to support, e.g., approximately twenty 52U racks at of 28.5 kW per rack up to 500 KW. The center may be divided into two sections, one is the IT or data module (or block) where the racks are stored, and the other is the cooling module (or block) (CB) where the mechanical cooling equipment resides. As an example, the module may be 512" L×246" W×159" H, with an operating temperature range of −30 F to 140 F. The total critical IT power may be 500 KW at N redundancy, with parasitic loads less than 75 KW from a separate power source. The IT servers may be powered by a distribution busway system with bus plugs that are configured based on server/rack mount PDU selection. Each bus plug may have two cable whips of up to 60 A for each whip, giving a total of 78 rack-mounted PDU connections to power up the IT gear.

Further, in one example, the center may have eight (8) fans and eight (8) coils, which are divided into four zones. Each coil may be a two part type of coil, the bottom part that has three rows of coil functioning as a latent coil while the top part that has two rows of coil function as a sensible coil. Each section of the two part coil has temperature sensors such that the controller may receive data used to control the air outlet temperature at the sensible coil temperature. In one exemplary embodiment, the cooling module may have space for a total of up to twelve (12) fans, but only eight (8) are installed for the D500CW version. Each fan may have the capacity for up to 12,000 CFM of air flow with 2" of water, giving a potential of up to 96,000 total CFM that the module can produce for cooling the data module.

Each zone may have sensors that control that zone. Each zone is capable of being "Enabled" or "Disabled" for low loads that are stacked into a single zone or multiple zones that doesn't cover the span of the whole module. By disabling zones that are not being used, the module Partial Power Usage Effectiveness (pPUE) is reduced thus the data center is saving even more energy.

In one example, each zone may include the following sensors:
(1) Hot Aisle Temperature Sensor
(1) CB Temperature Sensor Two coils with each one having:
(1) Sensible Temperature Sensor per coil
(1) Latent Temperature Sensor per coil
(1) Water Leaving Temperature Sensor
Two Fans with each one having:
(1) Differential Pressure Sensor
(1) Fan Power Status
(1) Fan Demand Position (via CFM)
(1) Fan Feedback Position (via CFM)
Two CCVs with each one having:
(1) Feedback Position
(1) Demand Position
(1) Leak Detector The data center module may have the following system-level sensors:
(1) Outside Temperature Sensor
(3) Humidity Sensors
(3) Differential Pressure Sensors
(2) Chilled Water Temperature Sensors
(5) Door Position Status Sensors
(10) Breaker Status/REPO Sensors
(4) Power Status Sensors
(2) Humidifier Status/Setpoint Sensors
(3) Make-Up Air Damper Status/Position Sensors
(4) Fire Panel Alarm Sensors Accordingly, the data center 100 may provide a multi-module product solution with a higher level of autonomous control, performance, scalability and design for customers requiring on-site, deployable data centers. Generally, the center is flexible and scalable to meet the critical usage model needs. In particular, such customers may include web scale, cloud, government, and mission critical enterprises with varying requirements, such as: modular footprint, essential, automated controls, availability, peak rack density, cooling optionality, time to deploy and commission, and the management of performance/risks. As desired, the center may be deployed as a Full-Turn-Key deployment model based on the needs and feedback of customers.

Exemplary features may include: NEMA 4 compatibility providing outdoor deployment in global locations; high density rack performance of up to 50 kW/rack; a higher level of autonomous control; and cost effective engineering. Exemplary advantages may include improved development and deployment schedule, performance, and cost. As such, additional capacity may be provided closer to the geographical needs of the customer. As a result, the physical layers associated with the management of data provide simplified and predictive system management, greater flexibility in scale and location, and more readily deployable solutions to optimize system performance along both operational and IT levels, thereby enabling the data center to drive new levels of energy efficiency and performance. The data center is particularly applicable to environments that require medium to high density levels of computing power within quickly deployable modular building blocks that have global deployment flexibility, including customers who require medium to high levels of density, provision their own applications as opposed to hosting external applications, desire high levels of scalability/flexibility in terms of system size and deployment location, and retain a high degree of uniformity in their infrastructure.

The data center may include the following attributes: control (system optimization, essential automation; autonomous software control); performance (financial; energy efficiency; top level rack density; time to deployment; commissioning); scalability (essential building blocks); and design (aesthetics; environments; fit and finish). The data center may enable the mitigation of capital costs via quick/instant deployment with modules/modular systems which are essentially plug and play for the following exemplary customers: web scale; federal government (DOD, Intelligence); rugged deployment; base or regional deployment; supporting consolidation; researchers/higher education; oil and gas; and health care.

As one example, the data module may house all rack mounted IT equipment when loaded. In one example, the space will be fully enclosed and support a sealed floor, 16-20 52U racks, bus distribution for up to 50 kW/rack with direct connections to the bus input, a 48" wide vestibule with single entry door from exterior and individual doors for cold or hot Aisle entrances, and lighting for the exterior entrance(s), internal aisle entrances and each hot and cold aisle. All walls may be field removable. It may also contain all necessary endpoints related to intelligent controls, fire safety systems, and the like. In one example, the cold aisle dimensions may be 40"-48" and the hot aisle dimensions may be a function of the size of the cold aisle and data equipment.

All access control may be pre-wired as standard with connection box covers. Cameras will be customer choice of either 1) installation of cameras of their choice or 2) installation of recommended cameras with OS integration. Access control may be any suitable customer choice, including card readers and/or biometric scanners.

In one exemplary embodiment, there is no system control within the data module, only sensor locations gathering information within the space as appropriate to OS requirements with regard to Access and Branch Circuit Monitoring. Final loading methodology may be determined in the design phase; however, it may be advantageous to enable top rigging as a result of the modules being potentially placed against each other in certain multi-module configurations.

The cooling and/or data module may house all subsystems and interconnects related to Intelligent Controls, Fire Safety, Cooling topologies; Water Cooled and Free Air (Direct) with Adiabatic Fluid. It may be a singular module which will be shipped separately and installed or attached to other modules in field. It may include all required Sensor/IO Points required as appropriate to OS needs. All equipment access may be made via the largest external wall to allow for all servicing/maintenance/repair as required. Final loading methodology may be determined in the design phase. The module may be capable of being loaded in multiples onto a transport vehicle, e.g., three or more on one vehicle.

Any power module may include UPS/SwitchGear and/or control sub-modules. As an example, the power module may house all related equipment to the UPS and SwitchGear. The power module may also contain all necessary endpoints related to intelligent controls related to managing the power system, etc.

Configurations may include:

| | |
|---|---|
| 500 kW capable Critical IT Load: Reduced frame (UPS/SwitchGear Block) | 750 kVA UPS |
| 1 MW capable Critical IT Load: Full size frame (UPS/SwitchGear Block) Scalable from 1 to 2 UPS @ 1200 kVA | 2 × 1200 kVA UPS |

One exemplary system requirement is that all modules are resident 480V. Any customer requirements that stipulate 400V may require a step down transformer at the module and not at the utility. The module may be modified or otherwise accommodate an enclosure of this transformer if required to be positioned outside of the modules themselves or the transformers can be built into the module. Accommodations for bus distribution may be provided, and due to the nature of 15-50 kW/rack range of densities, step function options in electrical requirements based on density needs from 15-50 kW/rack may be provided.

The following describes exemplary rack densities and bus distribution:

| Density | Bus |
|---|---|
| 15-19 kW/rack | 400 A |
| 20-30 kW/rack | 600 A |
| 31-50 kW/rack | 800 A |

Exemplary embodiments may include utility-based prefabricated modular data centers. In other words, the data center may be placed near a utility, thereby reducing the cost of additional transmission lines and community impact, while boosting reliability and efficiency at lower cost. The center may be specifically designed for power grid integration. It may be a dense, energy-efficient, quick-to-deploy data center with remote management and single-point control. Locating the data center next to the power supply enables utilities to meet demand without building additional transmission lines. It gives utilities an opportunity to make full use of existing infrastructure, including land resources and fiber optic networks. By avoiding the construction of new transmission lines, impact to the community and the environment is virtually eliminated. Bringing the demand to the supply also creates a collaborative environment between power users and power suppliers, so that utilities are not beholden to provide power wherever a new data center is built, regardless of capacity to deliver power in that area. Deploying modular data center technology in locations near or at existing electrical utility infrastructure provides direct connection to the energy grid. This may alleviate the need for redundant power feeds of the electrical grid for uninterruptible power supply to deliver a high level of power quality and reliability. Furthermore, locating the data center at the point of power supply reduces efficiency lost through transmission, generating significant cost savings, given that energy makes up a large share of the typical data center's operating costs. And the flexibility of the modular data center means it can be located near sources of alternative energy such as solar and wind power much more easily than a traditional data center could.

Exemplary embodiments may include centers deployed in Enterprise or HPC (High Performance Computing) compute environments to meet the specific computing availability requirements and allow power and cooling to scale up or down as future platform or technology changes impact the environment. The centers are designed to efficiently meet today's requirements but individual units scale to meet higher density requirements as IT transformations/optimizations maximize technology utilization rates or as new technology platforms are deployed. The centers accommodate growth by allowing deployment of additional capacity "just in time", thereby eliminating the risk of over provisioning data center capacity, a costly mistake in both data center builds, as well as in hedging capacity needs in colocation contracts. The centers provide energy efficiency, as well as the potential for mobility with appropriate planning. The centers improve day to day operations while meeting both short and long term objectives. The centers provide tiered reliability at the unit level based on specific application or compute availability requirements. The centers allow unique hybrid options, which combine traditional raised floor environments to accommodate low-density rack, low growth environments and others which accommodate variable loads, cloud deployments, mid-range densities as well as HPC compute environments. The centers may be deployed anywhere; outdoors, within an existing data center, brownfield facility, remotely, in new facilities and in multiple configurations to support hub/spoke requirements. The centers provide colocation partners with the same flexibility as above, but providing additional market differentiation, more flexibility to accommodate client specific needs as opposed to homogenous raised floor footprints in larger data center POD configurations. The centers may provide best practices on virtualization, cloud automation, and orchestration technologies to become a blueprint for higher availability and agility, standardization, interoperability, and enhanced support, particularly with accompanying DCIM operating capabilities; centralized monitoring, control and capacity planning with analytics capabilities.

Designed to meet heterogeneous and high power density requirements from 15 up to 50 kW/rack, the center may satisfy both HPC and Web Scale requirements with flexibility to add or reduce power in a single or multi-module configurations as the environmental demands. Predetermined density ranges may include solutions for requirements needing 15-19 kW, 20-25 kW, 20-30 kW and 30-45 kW/rack depending on computing and regional requirements. Redundancy levels can vary based on need but all solutions are concurrently maintainable. Additionally, these modules address individual HPC use cases by utilizing the right combination of power and cooling solutions based on the specific computing requirements.

The center may be designed to operate much like a traditional brick and mortar data center, with separation between the facilities and IT space. The equipment serviceable from the ground floor to provide ease of operation. The centers are designed to keep the outside environment from reaching the critical IT components to provide ruggedness. The centers may be designed with scalability in mind, and the IT modules can scale to a quad configuration for a contiguous space of IT space.

The center may provide an all-in-one solution providing a compact footprint design while enabling latency sensitivity applications to be deployed discreetly and in proximity to the end-user. The center is self-contained, providing power conditioning, cooling capacity and environmental subsystems. Deployable in single or multi-module configurations, a solution can be constructed to enable the right power and cooling capacities. All of these key features combined with low maintenance enabled by flywheel energy storage, integrated controls and OS may result in a solution which is simple and predictable while being highly cost efficient to operate.

Method steps can be performed by one or more programmable processors executing a computer program to perform functions of the technology by operating on input data and generating output. Method steps can also be performed by, and apparatus can be implemented as, special purpose logic circuitry, e.g., an FPGA (field programmable gate array) or an ASIC (application-specific integrated circuit). Modules can refer to portions of the computer program and/or the processor/special circuitry that implements that functionality.

Processors suitable for the execution of a computer program include, by way of example, both general and special purpose microprocessors, and any one or more processors of any kind of digital computer. Generally, a processor receives instructions and data from a read-only memory or a random access memory or both. The essential elements of a computer are a processor for executing instructions and one or more memory devices for storing instructions and data. Generally, a computer also includes, or be operatively coupled to receive data from or transfer data to, or both, one or more mass storage devices for storing data, e.g., magnetic, magneto-optical disks, or optical disks. Data transmission and instructions can also occur over a communications network. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

The technology has been described in terms of particular embodiments. The alternatives described herein are examples for illustration only and not to limit the alternatives in any way. The steps of the technology can be performed in a different order and still achieve desirable results.

The invention claimed is:

1. A modular data center, comprising:
   a cooling module comprising a cooling module enclosure and a first cooling unit housed within the cooling module enclosure, the cooling module enclosure comprising a first interface side wall with a first cooling module supply opening that receives a first portion of cooling air from the first cooling unit; and
   a data module comprising a data module enclosure for housing data equipment, the data module enclosure comprising a second interface side wall with a first data module supply opening that receives the first portion of the cooling air from the first cooling module supply opening such that the first portion of the cooling air flows into the data module enclosure and removes heat from the data equipment,
   wherein at least portions of the first cooling unit, the first cooling module supply opening, and the first data module supply opening are linearly aligned with one another.

2. The modular data center of claim 1, wherein the first cooling module supply opening and the first data module supply opening are directly coupled together.

3. The modular data center of claim 1, wherein the first cooling module supply opening and the first data module supply opening are aligned within one another.

4. The modular data center of claim 1, wherein the first cooling coil, the first cooling module supply opening, the first data module supply opening, and the data equipment are arranged such that the first portion of the cooling air flows between the first cooling coil and the data equipment with a primarily lateral direction.

5. The modular data center of claim 1, wherein the cooling module enclosure comprises an cooling module outer frame and a cooling module partitioning structure arranged within the cooling module outer frame, the cooling module partitioning structure defining a plurality of cooling module partitions, including a first cooling module partition housing the first cooling coil and defining a first cooling module supply channel extending at least between the first cooling coil and the first cooling module supply opening.

6. The modular data center of claim 5, wherein the first interface side wall defines a second cooling module supply opening, and the second interface side wall defines a second data module supply opening aligned with the second cooling module supply opening, wherein the cooling module further comprises at least a second cooling, and wherein the plurality of cooling module partitions includes at least a second cooling module partition housing the second cooling coil and a second cooling module supply channel extending at least between the second cooling coil and the second cooling module supply opening.

7. The modular data center of claim 6, wherein the first and second cooling module supply channels are adjacent one another in a longitudinal orientation and fluidly isolated from one another.

8. The modular data center of claim 7, wherein the data module enclosure further comprises a cold aisle laterally adjacent the second interface side wall, a series of data cabinets housing the data equipment laterally adjacent to the cold aisle, and a hot aisle laterally adjacent the data cabinets.

9. The module data center of claim 8, wherein the data module enclosure further comprises a floor supporting the cold aisle, the series of data cabinets, and the hot aisle, the data module enclosure further defining a data module return plenum extending between the hot aisle and a first data module return opening in the second interface side wall.

10. The modular data center of claim 9,
wherein the cooling module partitioning structure defines a third cooling module partition, and wherein the cooling module further comprises a first fan unit housed within the third cooling module partition, and
wherein the first interface side wall also defines a first cooling module return opening and the third cooling module partition defines a first cooling module return channel extending at least between the first fan unit and the first cooling module return opening.

11. The modular data center of claim 10, wherein the first cooling module supply channel is directly below the first cooling module return channel.

12. The modular data center of claim 11,
wherein the cooling module partitioning structure further defines a fourth cooling module partition, and wherein the cooling module further comprises a second fan unit housed within the fourth cooling module partition,
wherein the first interface side wall also defines a second cooling module return opening and the fourth cooling module partition defines a second cooling module return channel extending at least between the second fan unit and the second cooling module return opening.

13. The modular data center of claim 12, wherein said second data module supply opening such that the second portion of the cooling air flows into the data module enclosure and removes heat from the data equipment; and wherein the first and second fan units create a pressure differential such that the first and second portions of the cooling air flow from the first and second cooling coils, through the first and second cooling module supply openings, through the first and second data module supply openings, across the cold aisle, and across the data equipment to remove heat therefrom to result in heated air such that the heated air flows into the hot aisle, through the return plenum, through the first and second cooling module return openings back to the first and second cooling coils as a repeating cyclical air flow.

14. A modular data center, comprising:
a cooling module comprising:
a series of cooling module supply openings;
a cooling module frame;
a cooling module partitioning structure at least partially supported by the cooling module frame, the cooling module partitioning structure including a series of cooling module supply partitions, each forming a cooling module supply channel with a cooling module supply opening at an end of a respective one of the cooling module supply openings; and
a plurality of cooling coils, each respectively arranged in one of the cooling module supply partitions and generating a respective portion of cooling air, the cooling coils are each respectively disposed adjacent to one of the cooling module supply openings; and
a data module comprising:
a data module enclosure for housing data equipment, the data module enclosure comprising a data module interface side wall that defines a series of data module supply openings that receive the cooling air from the cooling module supply openings;
wherein a wall of the cooling module partitioning structure faces and adjacent to the data module interface side wall,
wherein the data module and cooling module are attached to one another with each of the series of data module supply openings being aligned with a respective one of the series of cooling module supply openings such that the portions of the cooling air from the cooling coils flow through the cooling module supply channels, through the cooling module supply openings, through the data module supply openings and onto the data equipment for the removal of heat from the data equipment.

15. The modular data center of claim 14, wherein the series of cooling module supply openings are arranged in a longitudinal row, and wherein at least portions of each of the series of cooling module supply channels, the series of cooling module supply openings, the plurality of cooling coils, and the series of data module supply openings are in a common horizontal plane.

16. The modular data center of claim 14, wherein the series of cooling module supply openings are arranged in a longitudinal row, and wherein the series of cooling module supply channels, the series of cooling module supply openings, the plurality of cooling coils, and the series of data module supply openings are arranged such that the portions of the cooling air flow between the plurality of cooling coils and the data equipment with a primarily lateral direction.

17. The modular data center of claim 16, wherein the data module enclosure further comprises
a cold aisle laterally adjacent the data module interface side wall,
a series of data cabinets housing the data equipment laterally adjacent to the cold aisle,
a hot aisle laterally adjacent the data cabinets, and
a floor supporting the cold aisle, the series of data cabinets, and the hot aisle, the data module enclosure further defining a data module return plenum extending between the hot aisle and a series of data module return openings in the data module interface side wall.

18. The modular data center of claim 17, wherein the cooling module partitioning structure defines a series of cooling module return partitions, each forming a respective cooling module return channel, fluidly coupled to a respective one of the series of data module return openings, and wherein the cooling module further comprises a plurality of fan units, each respectively arranged in one of the cooling module return partitions.

19. The modular data center of claim 18, further comprising a controller coupled to the data module and the cooling module and configured to adjust temperature, pressure and humidity associated with the data equipment in real time.

* * * * *